(12) United States Patent
Higuchi et al.

(10) Patent No.: US 9,166,614 B2
(45) Date of Patent: Oct. 20, 2015

(54) RAMP-SIGNAL GENERATOR CIRCUIT, AND IMAGE SENSOR AND IMAGING SYSTEM INCLUDING THE SAME

(71) Applicant: PANASONIC CORPORATION, Osaka (JP)

(72) Inventors: Masahiro Higuchi, Hyogo (JP); Kazuko Nishimura, Kyoto (JP); Yuusuke Yamaoka, Osaka (JP); Yutaka Abe, Osaka (JP); Hiroshi Fujinaka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 15 days.

(21) Appl. No.: 14/053,206

(22) Filed: Oct. 14, 2013

(65) Prior Publication Data

US 2014/0036124 A1 Feb. 6, 2014

Related U.S. Application Data

(63) Continuation of application No. PCT/JP2011/004258, filed on Jul. 27, 2011.

(30) Foreign Application Priority Data

Apr. 21, 2011 (JP) ................. 2011-095138

(51) Int. Cl.
*H04N 3/14* (2006.01)
*H04N 5/217* (2011.01)
(Continued)

(52) U.S. Cl.
CPC .............. *H03M 1/56* (2013.01); *H03M 1/0612* (2013.01); *H04N 5/3658* (2013.01); *H04N 5/378* (2013.01); *H03K 4/06* (2013.01); *H03M 1/123* (2013.01); *H03M 1/742* (2013.01)

(58) Field of Classification Search
CPC ......... H04N 3/14; H04N 5/217; H04N 5/228; H01L 27/00; H01L 31/012; H03M 1/56; H03M 1/06

USPC ............... 348/294–324, 241, 243, 222.1; 341/118, 122, 155, 169, 170; 250/208.1

See application file for complete search history.

(56) References Cited

U.S. PATENT DOCUMENTS 7,075,474 B2 * 7/2006 Yamagata et al. ............ 341/169
7,924,207 B2 * 4/2011 Snoeij et al. .................. 341/169
(Continued)

FOREIGN PATENT DOCUMENTS

JP 57-067433 4/1982
JP 2006-337139 A 12/2006
(Continued)

OTHER PUBLICATIONS

International Search Report for PCT/JP2011/004258 mailed Aug. 23, 2011, with English translation, 7 pages.

*Primary Examiner* — Tuan Ho
*Assistant Examiner* — Marly Camargo
(74) *Attorney, Agent, or Firm* — McDermott Will & Emery LLP

(57) ABSTRACT

The ramp-signal generator circuit includes a reference voltage generator that changes the voltage of a reference signal Vr to a comparator setting voltage VR for compensating for a voltage difference between a reference signal Vr and an analog input signal (Vs1-Vsn) before comparison by an analog-to-digital converter circuit and outputs a ramp signal whose slope starts from the comparator setting voltage VR in response to a start of the comparison. The ramp-signal generator circuit is configured to add a predetermined enhanced voltage VA to the comparator setting voltage VR before the comparison.

11 Claims, 17 Drawing Sheets

(51) Int. Cl.
  *H03M 1/56* (2006.01)
  *H04N 5/378* (2011.01)
  *H03M 1/06* (2006.01)
  *H04N 5/365* (2011.01)
  *H03M 1/12* (2006.01)
  *H03M 1/74* (2006.01)
  *H03K 4/06* (2006.01)

(56) References Cited

U.S. PATENT DOCUMENTS

2006/0284999 A1    12/2006  Muramatsu et al.
2007/0019091 A1*   1/2007   Muramatsu et al. .......... 348/308
2007/0038405 A1    2/2007   Kawabata
2008/0094271 A1*   4/2008   Tooyama et al. ............. 341/155
2010/0271248 A1*   10/2010  Yamaoka et al. ............. 341/155
2011/0248145 A1*   10/2011  Tanaka ....................... 250/208.1
2012/0001057 A1*   1/2012   Yamagata et al. .......... 250/208.1

FOREIGN PATENT DOCUMENTS

JP     2006-340044 A    12/2006
JP     2009-077172 A    4/2009
WO     2009/090703 A1   7/2009

\* cited by examiner

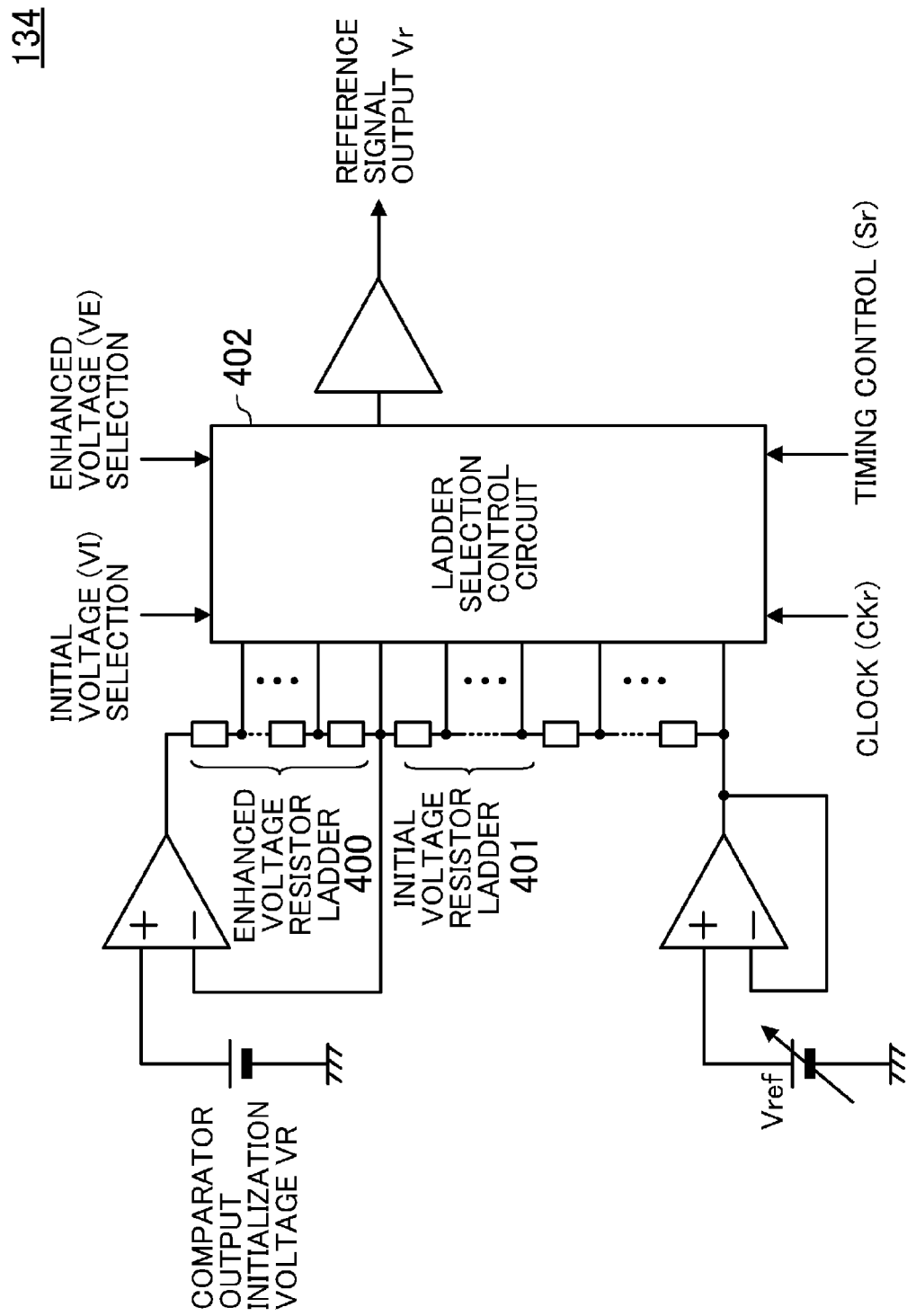

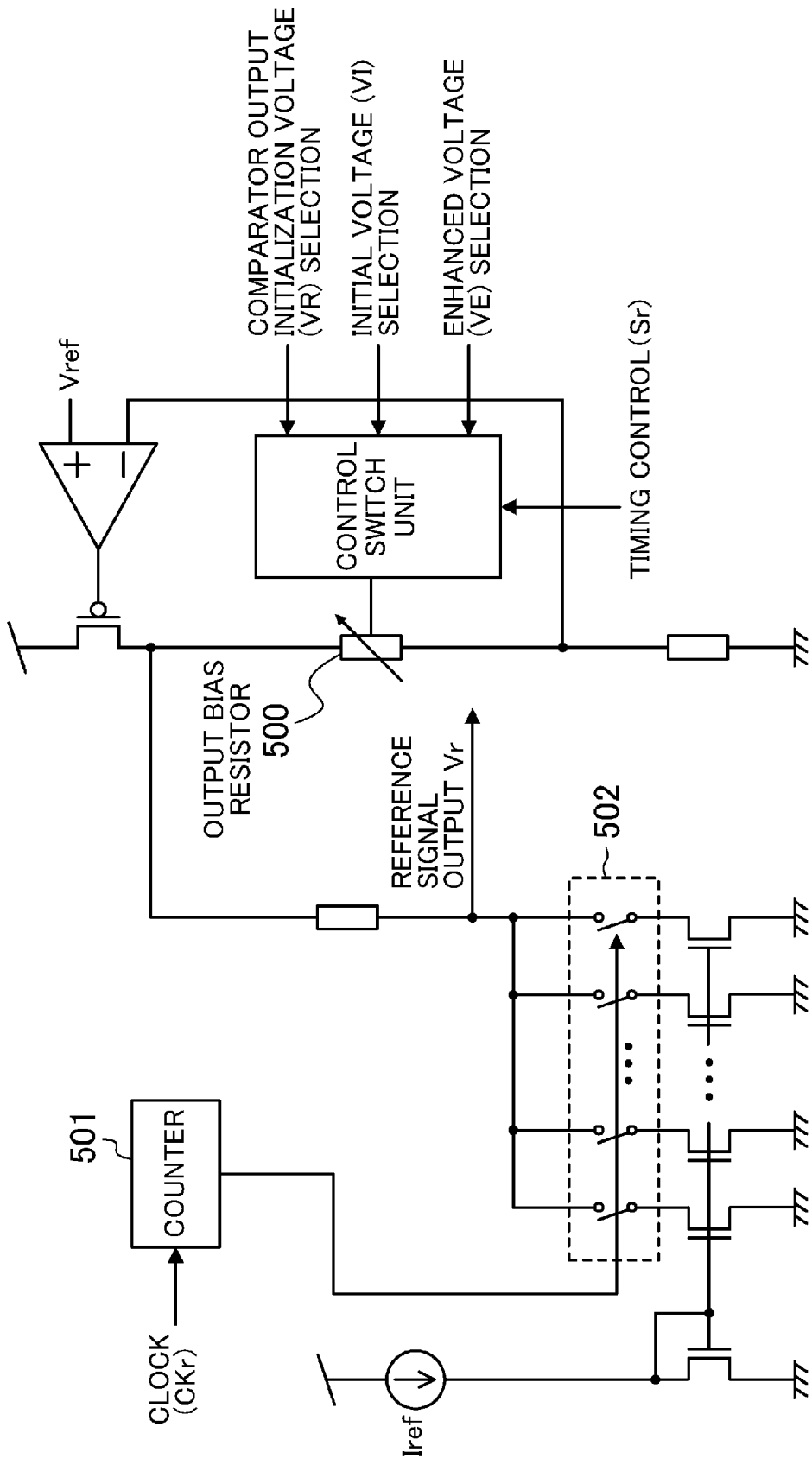

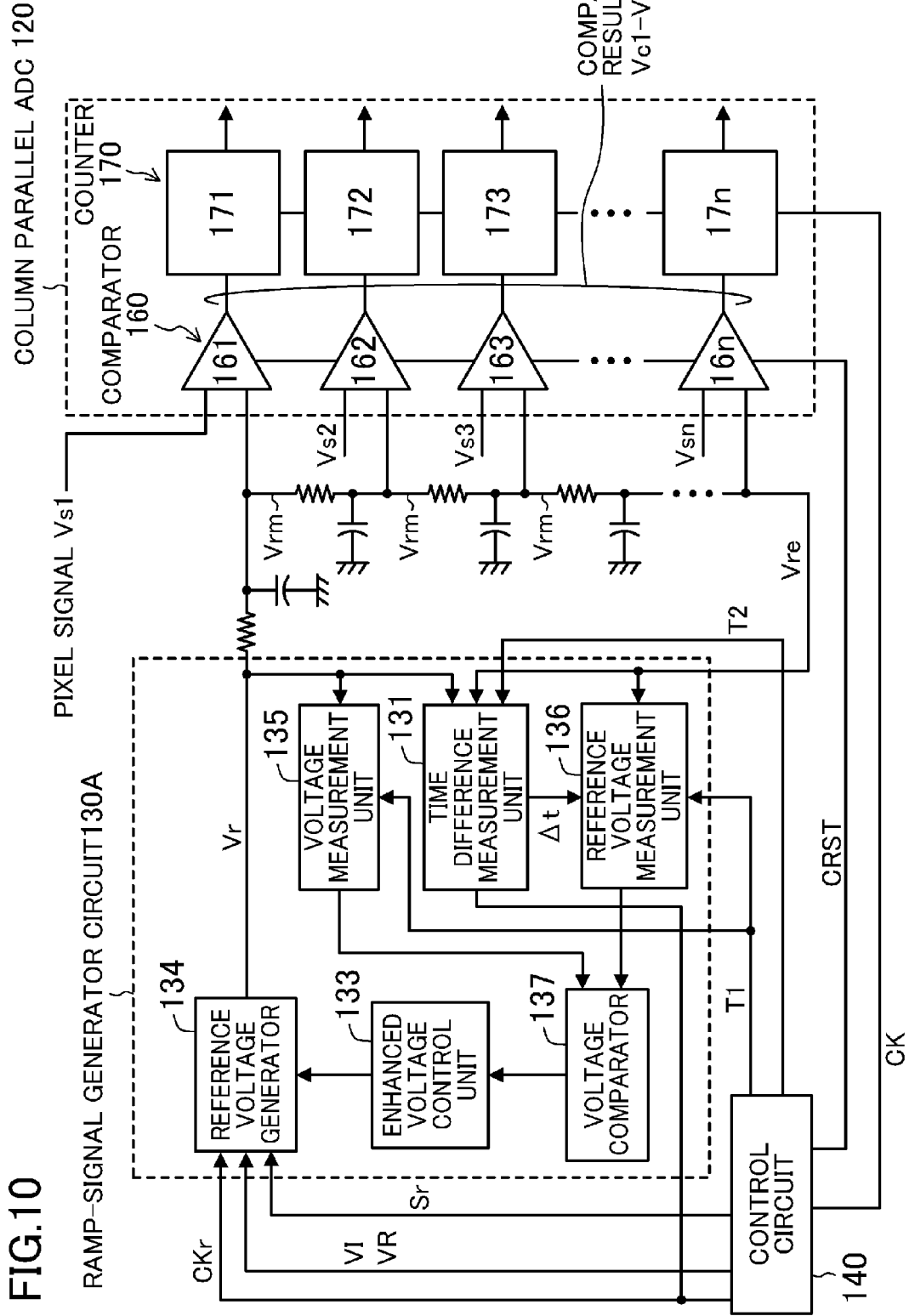

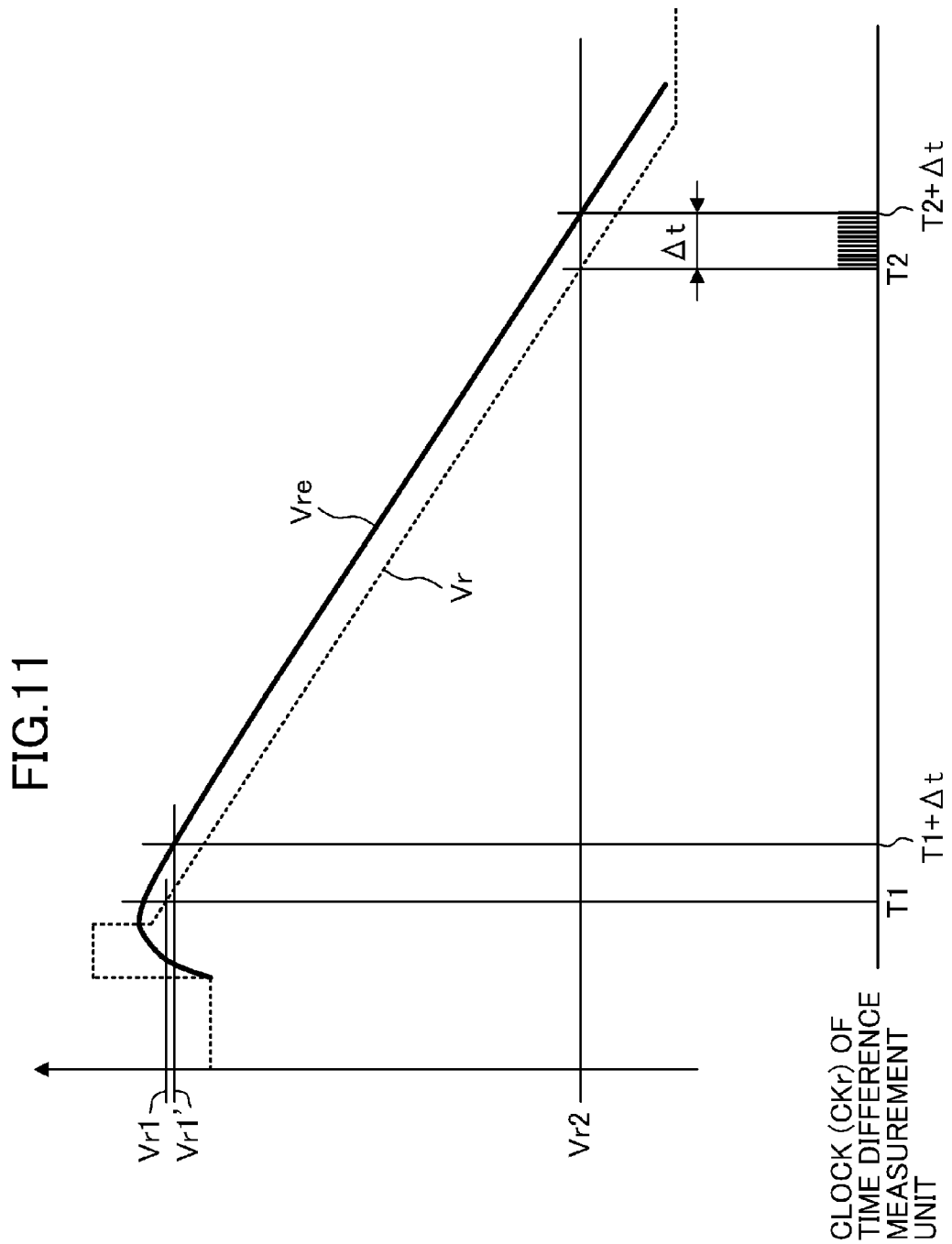

us 9,166,614 B2

RAMP-SIGNAL GENERATOR CIRCUIT, AND IMAGE SENSOR AND IMAGING SYSTEM INCLUDING THE SAME

CROSS-REFERENCE TO RELATED APPLICATIONS

This is a continuation of International Application No. PCT/JP2011/004258 filed on Jul. 27, 2011, which claims priority to Japanese Patent Application No. 2011-095138 filed on Apr. 21, 2011. The entire disclosures of these applications are incorporated by reference herein.

BACKGROUND

The present disclosure relates to image sensors and imaging systems, and more particularly to a ramp-signal generator circuit that outputs a reference signal to a single slope (or integrating- or counter-type) analog-to-digital converter (hereinafter referred to as an ADC) included in an image sensor or an imaging device.

Image sensors each of which performs column parallel analog-to-digital (AD) conversion with an ADC provided in each column of a pixel array of the image sensor such that pixel output signals from a single row of the pixel array are subjected to AD conversion at a time in a horizontal scanning period, have been developed and put into practical use. In this column parallel AD conversion, a single-slope ADC whose circuit scale is relatively small is typically employed because of a limited area of each column determined depending on the pixel pitch (see, for example, Japanese Patent Publication No. 2006-340044). In the single-slope ADC, a ramp signal correlated with a count value of a counter is input as a reference signal to a comparator of the ADC, and based on a count value obtained when this reference signal coincides with an analog input signal (a pixel output signal), an AD conversion result is output as a digital signal.

FIG. 12 is a block diagram illustrating an example configuration of a conventional image sensor.

A column parallel ADC (a single-slope ADC) 620 includes comparators 660 (661-66p) (where p is a natural number) and counters 670 (671-67p). The column parallel ADC 620 compares, in the comparators 660, a reference signal Vr from a ramp-signal generator circuit 630 with pixel signals Vs1-Vsp from a pixel array 610, and based on counting results of comparison results Vc1-Vcp obtained by the counters 670 (671-67p), outputs an AD conversion result (a digital signal).

The column parallel ADC 620 included in the image sensor performs AD conversion through a procedure called digital correlated double sampling (CDS). In the digital CDS, two AD conversion processes, i.e., an AD conversion process on reset levels of the pixel signals Vs1-Vsp and an AD conversion process on a signal level, are performed, and the difference between these AD conversion processes is used as an AD conversion result on the Vs1-Vsp so as to reduce fixed pattern noise due to characteristic variations among pixels of the pixel array 610 and the comparators 660.

Referring to a timing chart of FIG. 13, operation of the digital CDS will be specifically described.

First, in a period from time T30 to time T31, the pixel array 610 outputs a reset level voltage V1 as a pixel signal Vsx (where x=1–p). The reference signal Vr from the ramp-signal generator circuit 630 is set at an initial voltage VI that has been previously set by the control circuit 640. In this state, the control circuit 640 sets a reset signal CRST at "L" and resets the comparators 660. Specifically, a comparator 66x (where x=1–p) includes a differential amplifier having input capacitances 3a and 3b and an inverter (INV) amplifier 3i having an input capacitance 3c, as illustrated in FIG. 14, for example. In response to an input of the reset signal CRST, reset transistors 3f, 3g, and 3h cause short circuits between the gates and drains of the differential transistors 3d and 3e and between the input and output of the INV amplifier 3i, and thereby, the comparator 66x is reset to a balanced state.

In a period from time T31 to time T32, the control circuit 640 drives a comparator output initialization control signal Sr. Then, the ramp-signal generator circuit 630 changes the reference signal Vr from the initial voltage VI to a comparator initialization voltage VR, and holds the comparator initialization voltage VR. Here, the comparator initialization voltage VR is a voltage that is used for compensating for a voltage difference (i.e., comparison) between the reference signal Vr and the pixel signal Vsx after initialization of the comparator 66x, and is higher, by a compensation voltage, than the initial voltage VI previously set by the control circuit 640. In this manner, the comparator 66x (where x=1–p) is defined (initialized) from the balanced state to a state where the comparison result Vcx (where x=1–p) is "H."

At time T32, the control circuit 640 starts driving a counter clock CK, and the reference signal Vr becomes a sloped ramp signal whose slope starts from the comparator initialization voltage VR. With the start of output of the ramp signal, the counter 67x (where x=1–p) starts down-counting from an initial count value, and comparison for a first AD conversion process starts.

At time T33, when the reference signal Vr in the comparator 66x coincides with the pixel signal Vsx (the reset level voltage V1), the comparison result Vcx transitions to "L" and the counter 67x stops down-counting, and holds the count value (a count width Vd) at this time.

In a period from time T34 to time T35, the control circuit 640 drives the comparator output initialization control signal Sr again. Then, the ramp-signal generator circuit 630 changes the reference signal Vr to the comparator initialization voltage VR again, thereby initializing the comparison result Vcx (where x=1–p) to "H." The pixel array 610 outputs a pixel signal Vsx which has been changed to a reset level voltage V2, and enters a standby state until the state is stabilized.

At time T35, the control circuit 640 starts driving of the counter clock CK, and the reference signal Vr becomes a sloped ramp signal whose slope starts from the comparator initialization voltage VR. Then, with the start of output of the ramp signal, the counter 67x starts up-counting based on the count value held in the first AD conversion process, and comparison for a second AD conversion process is started.

At time T36, when the reference signal Vr in the comparator 66x coincides with the pixel signal Vsx (the reset level voltage V2), the comparison result Vcx transitions to "L" and the counter 67x stops up-counting, and holds a count value at this time. The difference between the count value at time T33 and the count value at time T36 is equal to the difference value between the first AD conversion process and the second AD conversion process, i.e., serves as an AD conversion result of the difference (V1–V2) in amplitude of the pixel signal Vsx.

In recent years, the number of pixels in a digital camera system has increased rapidly. In addition, a newly installed function of capturing a high-definition video image has increased the speed of driving image sensors. The increased speed causes problems, which will be described below, in AD conversion using the above-described digital CDS, and various techniques have been proposed to solve the problems.

For example, to catch up with the increase in speed, a double-data-rate (DDR) technique that uses timings at both rising and falling edges of a clock is employed. In the above example (Japanese Patent Publication No. 2006-340044), a clock signal line supplies a common clock to the ramp-signal generator circuit 630 and the counters 670. Thus, the clock signal line is extended to a long distance. When the frequency of this clock increases, a load due to wiring resistance and/or wiring capacitance causes rounding of a clock waveform and a decrease in duty ratio, resulting in degradation of differential non-linearity (DNL) characteristics of AD conversion.

To solve such a problem, Japanese Patent Publication No. 2009-077172 proposes a technique for smoothing a ramp signal waveform by dividing, and thereby, reducing the frequency of a clock to be supplied to a ramp-signal generator circuit, and inserting a low-pass filter (LPF) in a path for an output signal from the ramp-signal generator circuit. This technique can reduce degradation of DNL characteristics due to rounding of a clock waveform or a decrease in duty ratio.

As described above, AD conversion of digital CDS is implemented by two AD conversion processes. To achieve high-speed driving, an AD conversion period is preferably minimized.

In view of this, United States Patent Application No. 2010/0271248 proposes a technique for reducing an AD conversion period in digital CDS. Specifically, in this technique, a linear period of a ramp wave is extended within a ramp wave generation period (e.g., a down-counting period or an up-counting period in FIG. 13). More specifically, an output section of the ramp-signal generator circuit is driven by a buffer, and is coupled to a large number of ADCs. An input section of the buffer in the output section of the ramp-signal generator circuit includes an LPF for smoothing glitch noise. Switching of a time constant of this glitch smoothing LPF can reduce rounding at a start of output of a ramp wave.

Japanese Patent Publication No. 2006-337139 shows a technique for enhancing high-speed responsiveness of a ramp wave generator. Specifically, in this technique, a ramp wave and a square wave are added at the same timing, thereby achieving high-speed ramp wave generation.

SUMMARY

In the above-described conventional techniques, however, achieving both accurate AD conversion and a reduced period of AD conversion still involves unsolved problems when an excessive load is applied especially to a reference signal because of an increased input load to the reference signal caused by extension of wiring and an increase in the number of ADCs due to an increased the number of pixels.

In the configuration of Japanese Patent Publication No. 2009-077172, for example, frequency division of the clock and insertion of the LPF can reduce degradation of linearity due to rounding of the waveform of a high-speed clock, but still has difficulty in reducing an AD conversion period because of accelerated rounding of the waveform in starting output of a ramp wave.

In the configuration of United States Patent Application No. 2010/0271248, switching of the time constant of the LPF for smoothing glitch can achieve quick response at the rising edge of a ramp waveform in the input section of the output buffer of the ramp-signal generator circuit, but inevitably has the problem of rounding of the waveform due to extension of wiring after output of an output buffer and an input load of an ADC.

Japanese Patent Publication No. 2006-337139 describes a technique for improving responsiveness at the rising edge of the output waveform of the ramp wave generator. This technique, however, needs large circuit scales of a square wave generator and a waveform adder, and such large circuit scales are disadvantageous in installation in an image sensor or an imaging system. Similarly to the technique of United States Patent Application No. 2010/0271248, the problem of rounding of the waveform caused by an increased output load (i.e., extension of wiring and an input load of an ADC) inevitably occurs.

Referring now to FIGS. 15-17, rounding of a waveform caused by an increased output load (i.e., extension of wiring and an input load of an ADC) in a ramp-signal generator circuit will be specifically described.

FIG. 15 is a graph showing transient characteristics of a reference signal Vr (Vre) in a first AD conversion process of a digital CDS of the column parallel ADC 620 included in a conventional image sensor.

At time T40, a reference signal Vr from the ramp-signal generator circuit 630 is changed from an initial voltage VI to a comparator initialization voltage VR. Then, at time T41, a ramp signal that is sloped, in terms of time, from the comparator initialization voltage VR with a predetermined inclination is output as a reference signal Vr. However, a load on a reference signal line path and loads on a large number of commonly connected comparators 660 (661-66p) of the column parallel ADC 620 causes, for example, a reference signal Vre in an input section of the comparator 66p located farthest from the ramp-signal generator circuit 630 to show transient characteristics as indicated by the bold continuous line in FIG. 15, and this reference signal Vre is transmitted to the comparator 66p.

Here, to perform AD conversion accurately, a voltage width in which the reference signal Vre changes in a period corresponding to a single count of the each of the counters 670 needs to be constant (i.e., the slope of the reference signal Vre needs to have reached a linear region). In FIG. 15, however, the slope of the reference signal Vre reaches the linear region at point A, i.e., AD conversion is not performed accurately until the reference signal Vre reaches point A.

In the example of FIG. 15, the reference signal Vre has already reached the linear region before reaching the initial voltage VI, and thus, a first AD conversion process in the digital CDS can be accurately performed.

Specifically, the first AD conversion process in the digital CDS convers the reset level of a pixel signal hardly showing variations depending on the amount of incident light, and in addition, each of the comparators 660 has the input capacitances 3a and 3b as illustrated in FIG. 14. To perform comparison after temporary initialization of the comparators 660, comparison is ideally completed when the reference signal Vre input to the column parallel ADC 620 becomes equal to the initial voltage VI shown in FIG. 15. Thus, it is sufficient that the slope of the ramp waveform of the reference signal Vre has already reached the linear region when the pixel signal Vsx and the reference signal Vre coincide with each other. That is, in the example of FIG. 15, since the reference signal Vre has already reached the linear region before the reference signal Vre comes to be at the initial voltage VI, the first AD conversion process in the digital CDS can be accurately performed.

FIG. 16 is a graph showing differential characteristics between the reference signal Vr and the reference signal Vre shown in FIG. 15. The time when the difference between the reference signal Vr and the reference signal Vre becomes constant can be defined as the time when the reference signal Vre reaches the linear region, and similarly to the example of FIG. 15, it can be determined that the reference signal Vre has already reached the linear region at point A.

However, in the case of an increased speed (e.g., in the case of a reduced output period of the comparator initialization voltage VR in FIG. 15, i.e., a period from T40 to T41), the reference signal Vre at the time when the ramp-signal generator circuit 630 starts outputting a ramp signal starts transitioning from a voltage lower than that at point C (i.e., a voltage different from the comparator initialization voltage VR). That is, the time at which the reference signal Vre reaches the linear region is located after point A.

In the case of an increased number of pixels of the image sensor, similar problems also arise and a delay of the reference signal Vre caused by an increased load due to an increased number of the comparators 660 and/or the lines of the column parallel ADC 620 coupled to the pixel array 610 is expected to increase. Thus, in the example of FIG. 15, when the voltage of the reference signal Vre reaches the initial voltage VI, the reference signal Vre might not reach the linear region.

Then, it will be described how such a situation affects AD conversion characteristics.

FIG. 17 is a graph showing a relationship between the voltage waveform of the reference signal Vre in the state of FIG. 15 and AD conversion characteristics. In FIG. 17, for example, in a state in which the signal level of a pixel signal in a second AD conversion process of the digital CDS is dark (i.e., the pixel signal has a voltage near a reset level), the slope of a ramp signal at a time (point D) when comparison is completed is gentler than an ideal slope, and a change in the reference signal Vre is small in a period corresponding to a single count. That is, the number of counts of AD conversion increases, and the AD conversion gain is larger than an ideal gain (point F). On the other hand, in a normal state (typically with about several hundred millivolts (mV)), the slope of the ramp signal at a time of comparison completion (point E) is equal to that of an ideal reference signal (the reference signal Vr), and thus, the AD conversion gain is equal to an ideal gain (point G).

As described above, if the reference signal Vre has not reached the linear region when the voltage of the reference signal Vre reaches the initial voltage VI, linearity of the column parallel ADC 620 deteriorates in a region where the amplitude of the pixel signal Vsx is small.

It is therefore an object of the present disclosure to provide a ramp-signal generator circuit capable of reducing a period necessary for AD conversion while performing accurate AD conversion even with an excessive load especially on a reference signal due to extension of wiring and/or an input load of an ADC in AD conversion by a single-slope ADC.

An aspect of the present disclosure is directed to a ramp-signal generator circuit that outputs, to a single-slope analog-to-digital converter circuit, a ramp signal that is sloped in terms of time with a predetermined inclination, as a reference signal. The analog-to-digital converter circuit includes a comparator having first and second input terminals and configured to receive the reference signal at the first input terminal and to receive an analog input signal at the second input terminal. The analog-to-digital converter circuit converts the analog input signal into a digital signal based on a result of comparison by the comparator. The ramp-signal generator circuit includes a reference voltage generator configured to change a voltage of the reference signal to a comparator setting voltage for compensating for a voltage difference between the first and second input terminals of the comparator before the comparison, and configured to output the ramp signal whose slope starts from the comparator setting voltage in response to a start of the comparison. The ramp-signal generator circuit is configured to add a predetermined enhanced voltage to the comparator setting voltage before the comparison.

In this configuration, the voltage of the reference signal is changed to the comparator setting voltage for compensating for the voltage difference between the first and second input terminals of the comparator of the analog-to-digital converter circuit (ADC), i.e., compensating for comparison by the ADC, before the comparison. In addition, the predetermined enhanced voltage is added to the comparator setting voltage, and the resultant comparator setting voltage is output as the reference signal. This configuration can support not only compensation for the comparison by the comparator in which a voltage difference between the first and second input terminals of the comparator is compensated for, but also rising of the reference signal in the input section of the comparator of the ADC even with an excessive load due to extension of wiring and an input load of the ADC. In this manner, a period until the slope of the ramp signal at the output section of the ramp-signal generator becomes substantially equal to that at the input section of the comparator of the ADC can be shortened. That is, it is possible to reduce a period necessary for AD conversion while performing accurate AD conversion.

The ramp-signal generator circuit may be configured to change a period from both the change of the reference signal voltage to the comparator setting voltage and the addition of the enhanced voltage to a start of output of the ramp signal, before a start of the comparison.

This configuration can perform control of a period from addition of the enhanced voltage to a start of output of the ramp signal in combination with control of the voltage value of the enhanced voltage. In this manner, the AD conversion period can be tuned in a minimum period.

The analog-to-digital converter circuit may include a counter configured to count a comparison time of the comparator in order to generate the digital signal based on a result of counting by the counter. The ramp-signal generator circuit may be configured to change a time of starting an output of the ramp signal relative to a time of starting the counting by the counter of the analog-to-digital converter circuit.

This configuration can control a period from the addition of the enhanced voltage to the start of output of the ramp signal, and can set a start time of the ramp signal relative to the time of starting counting by the counter of the ADC. In this manner, in a case where the slope of the ramp waveform output from the ramp-signal generator circuit is gentle (i.e., an AD conversion gain is large), when the amplitude of the reference signal input to the comparator of the ADC is small, a failure of termination of AD conversion within a certain down-counting period does not easily occur.

The ramp-signal generator circuit may further include: a time difference measurement unit configured to measure a time difference between a time when an output voltage of the reference voltage generator reaches a predetermined voltage and a time when a voltage at the first input terminal of the comparator reaches the predetermined voltage; a time difference comparator configured to compare a first time difference that is the time difference measured by the time difference measurement unit at an initial point of an output period of the ramp signal with a second time difference that is the time difference at a point of time when a slope of the ramp signal is stabilized; and an enhanced voltage control unit configured to control the enhanced voltage such that the first time difference coincides with the second time difference based on a result of the comparison by the time difference comparator.

In this configuration, a time difference between a time until the output voltage of the ramp-signal generator circuit reaches a predetermined voltages and a time until the voltage at the first input terminal reaches the predetermined voltage is measured at an initial period of an output period of the ramp signal and a time when the slope of the ramp signal is stabilized, and based on a result of comparison of the time differences, the enhanced voltage is controlled. That is, feedback control can be performed based on the comparison result of the time differences. In this manner, the above operation is repeatedly performed in, for example, a period in which an image output of the imaging system is invalid, thereby optimizing the value of the enhanced voltage. In addition, even with a variation of a load on the voltage path among the devices, the feedback control can reduce a variation in characteristics while maintaining excellent AD conversion characteristics.

The ramp-signal generator circuit may further include: an output voltage measurement unit configured to measure an output voltage of the reference voltage generator; a reference voltage measurement unit configured to measure a voltage at the first input terminal of the comparator; a time difference measurement unit configured to measure a time difference between a time when an output voltage of the reference voltage generator reaches a predetermined voltage and a time when a voltage at the first input terminal of the comparator reaches the predetermined voltage; a voltage comparator configured to compare a first voltage measured by the output voltage measurement unit at a predetermined time in an initial period of an output period of the ramp signal with a second voltage measured by the reference voltage measurement unit when the time difference measured by the time difference measurement unit is elapsed from the predetermined time; and an enhanced voltage control unit configured to control the enhanced voltage such that the first voltage coincides with the second voltage based on a result of the comparison by the voltage comparator.

This configuration can control the enhanced voltage based on a result of comparison between the first voltage measured at the predetermined time in an initial period of the output period of the ramp signal and the second voltage measured when the time difference measured by the time difference measurement unit is elapsed from the predetermined time at which the first voltage is measured. That is, feedback control can be performed based on the comparison result of the first voltage and the second voltage. In this manner, the above operation is repeatedly performed in, for example, a period in which an image output of the imaging system is invalid, thereby optimizing the value of the enhanced voltage. In addition, even with a variation of a load on the voltage path among the devices, the feedback control can reduce a variation in characteristics while maintaining excellent AD conversion characteristics.

According to the present disclosure, it is possible to shorten a period necessary for AD conversion while performing accurate AD conversion even with an excessive load especially on a reference signal in a ramp-signal generator circuit that outputs a ramp signal to a single-slope ADC as a reference signal.

In particular, application of the present disclosure to a column parallel ADC (a single-slope ADC) included in an image sensor can significantly shorten an AD conversion period of down-counting, and thereby, enables high-speed driving even with an increased number of pixels.

BRIEF DESCRIPTION OF THE DRAWINGS

FIG. 8 illustrates another example configuration of the reference voltage generator of the first embodiment.

FIG. 9 illustrates another example configuration of the reference voltage generator of the first embodiment.

FIG. 10 illustrates an example configuration of a ramp-signal generator circuit according to a second embodiment and an example connection of its peripheral circuits.

FIG. 11 shows operation of a voltage measurement unit and a time difference measurement unit according to the second embodiment.

DETAILED DESCRIPTION

Embodiments of the present disclosure will be described with reference to the drawings.

In this embodiment, AD conversion of digital CDS is constituted by two AD conversion processes where the second AD conversion process converts the signal level of a pixel signal. Thus, it is necessary to convert signals with various voltage amplitudes depending on the amount of incident light, and a system needs a period corresponding to all the quantized counts of an ADC is needed as an AD conversion period. On the other hand, the first AD conversion process converts substantially the same reset level of all the pixels, and thus, a down-counting period can be reduced within a range including a variation in the down-counting width. In view of this, the following embodiments are focused on a first AD conversion process that converts reset levels of pixel signals hardly showing variations depending on the amount of incident light, between the two AD conversion processes in the digital CDS. In addition, the following embodiments are directed to reduction of a period of the first AD conversion process. In terms of performing accurate AD conversion, the following embodiments are advantageous not only in the first AD conversion process but also in the second AD conversion process in the digital CDS.

First Embodiment

Figure 1:
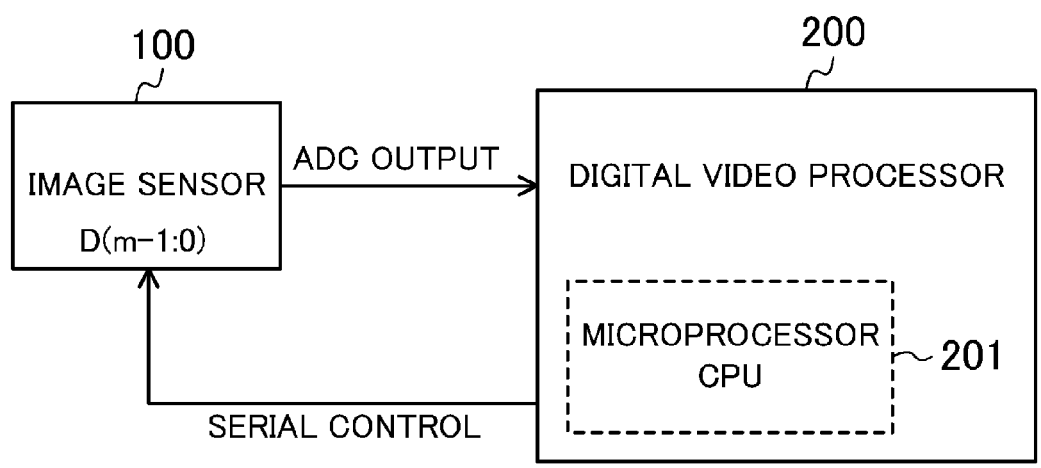
FIG. 1 is a block diagram schematically illustrating an imaging system according to each embodiment.

FIG. 1 is a block diagram schematically illustrating an imaging system according to a first embodiment. In FIG. 1, the imaging system includes an image sensor 100 and a digital video processor 200.

The digital video processor 200 includes a microprocessor CPU 201, and controls the image sensor 100 based on serial control signals D (m−1:0) (where m is a natural number of two or more) from the microprocessor CPU 201, and performs video signal processing based on a digital signal (an ADC output signal) from the image sensor 100.

Figure 2:
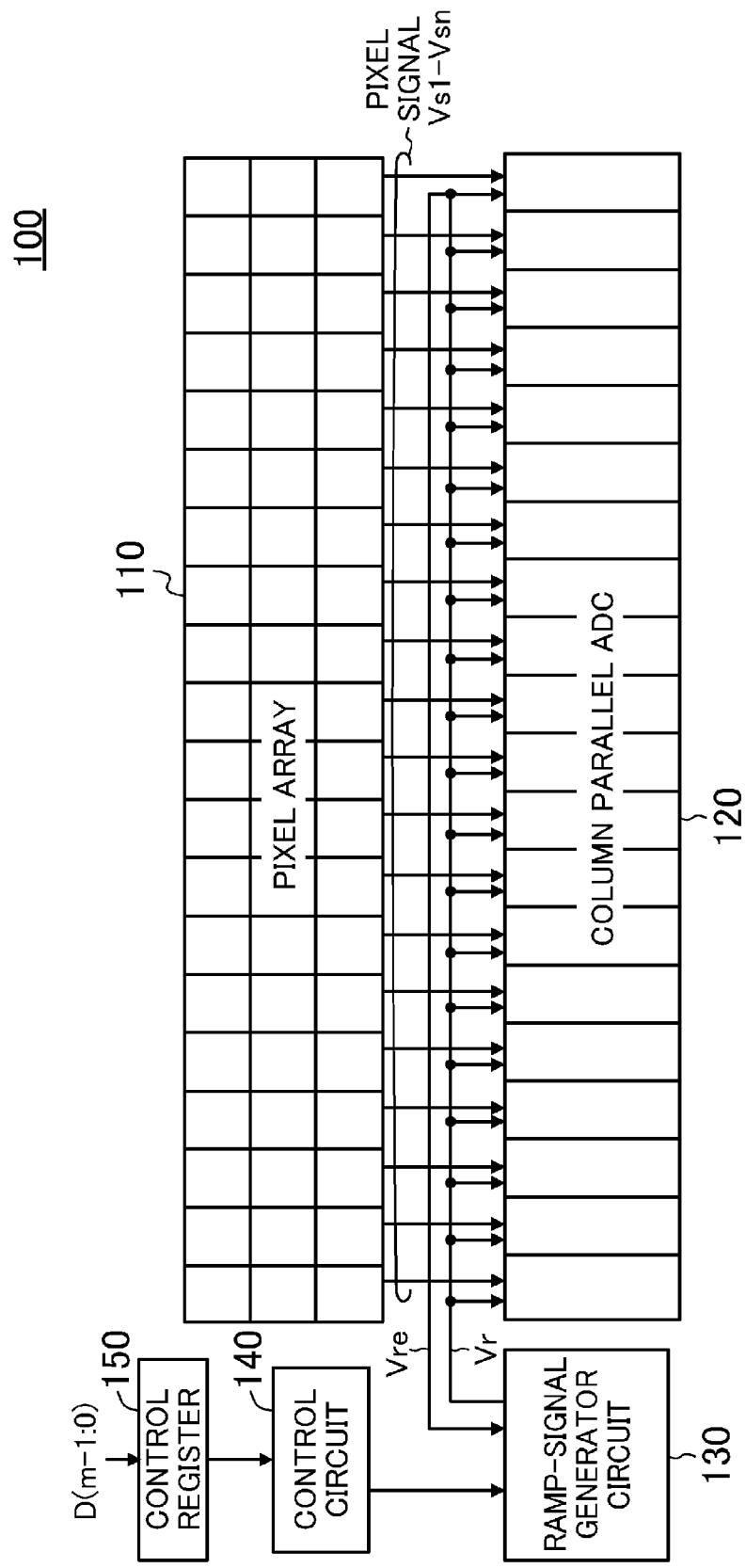
FIG. 2 is a block diagram schematically illustrating an image sensor according to each embodiment.

FIG. 2 is a block diagram schematically illustrating the image sensor 100 of the first embodiment. In FIG. 2, the image sensor 100 includes a pixel array 110, a column parallel ADC (a single-slope ADC) 120, a ramp-signal generator circuit 130, a control circuit 140, and a control register 150.

In the pixel array 110, unit pixels each including a photodiode and an amplifier are two-dimensionally arranged in columns and rows. The pixel array 110 outputs pixel signals Vs1-Vsn subjected to photoelectric conversion in n (where n is a natural number) unit pixels belonging to a selected row, at the same time in parallel with each other.

In this embodiment, the column parallel ADC 120 is a single-slope ADC. The column parallel ADC 120 includes comparators 160 (161-16n) and counters 170 (171-17n), which will be described later (see FIG. 5). Each of the comparators 160 (161-16n) compares a reference signal Vr (Vre) from the ramp-signal generator circuit 130 with an associated one of the pixel signals Vs1-Vsn, which are analog input signals from the pixel array 110, and outputs an AD conversion result (a digital signal) based on a count value obtained when the associated one of the pixel signals Vs1-Vsn coincides with the reference signal Vr (Vre) (i.e., when an associated one of comparison results Vc1-Vcn, which will be described later, is inverted).

In the image sensor 100, a serial control signal D (where m−1:0) output from the microprocessor CPU 201 is input to the control circuit 140 through the control register 150. The control circuit 140 controls the ramp-signal generator circuit 130 and the column parallel ADC 120. In response to a control signal from the control circuit 140, the ramp-signal generator circuit 130 outputs, as the reference signal Vr, a ramp signal that is sloped in terms of time with a predetermined inclination.

Figure 3:
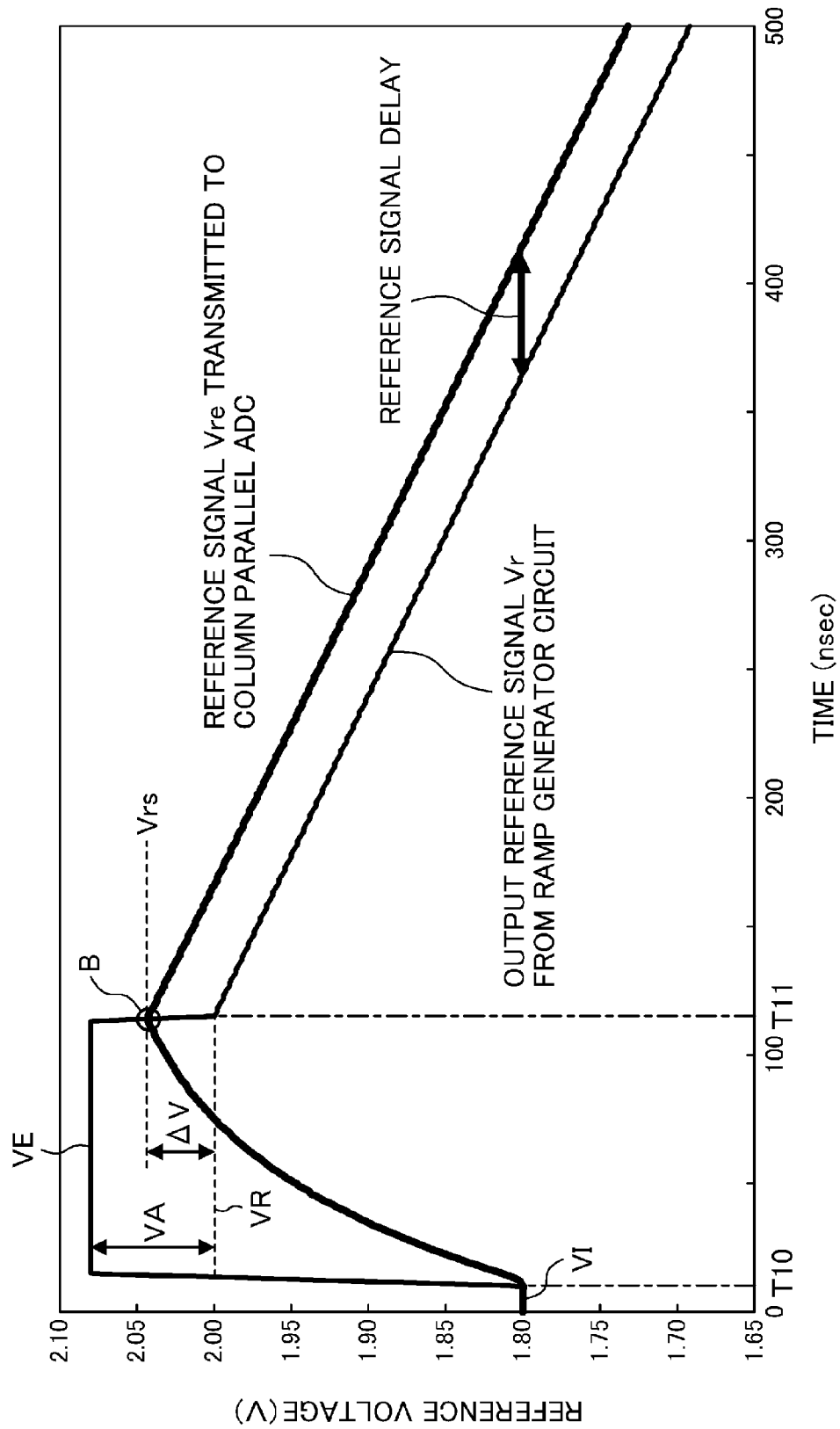
FIG. 3 shows an example reference signal waveform of a ramp-signal generator circuit according to a first embodiment.

FIG. 3 shows an example of transient characteristics of a reference signal Vr in an output section of the ramp-signal generator circuit 130 (hereinafter referred to as a reference signal Vr) and a reference signal Vre in an input section of a comparator 16n of the column parallel ADC 120 in a column farthest from the ramp-signal generator circuit 130 (hereinafter referred to as a reference signal Vre), in reference signals of this embodiment. In FIG. 3, a thin line represents the reference signal Vr, and the bold line represents the reference signal Vre. At time T10, based on a control signal from the control circuit 140, the ramp-signal generator circuit 130 changes the reference signal Vr from an initial voltage VI to a comparator initialization voltage VE obtained by adding an enhanced voltage VA to a comparator initialization voltage VR. In a period from time T10 to time T11, the ramp-signal generator circuit 130 continuously outputs the comparator initialization voltage VE. In this period, the reference signal Vre shows a change as indicated by the bold line under the influence of transient characteristics caused by a load applied this reference signal Vre. At time T11 when the ramp-signal generator circuit 130 outputs a ramp signal as the reference signal Vr, the ramp-signal generator circuit 130 changes the reference signal Vr from the comparator initialization voltage VE to the comparator initialization voltage VR, and outputs a ramp signal as the reference signal Vr. Then, at this time, the reference signal Vre has already reached a ramp start voltage Vrs that is higher than the comparator initialization voltage VR by a voltage ΔN (point B in FIG. 3). Quantitatively, to advance the time when the reference signal Vre reaches point B in FIG. 3, the time when an output of the ramp signal is started and the time when counting by the counters 170 of the column parallel ADC 120, which will be described later, are advanced, and the enhanced voltage VA is increased, i.e., the comparator initialization voltage VE is increased.

In FIG. 3, the change of the reference signal Vr to the comparator initialization voltage VR and the change of adding the enhanced voltage VA are performed at the same time. Alternatively, the time when the reference signal Vr is changed to the comparator initialization voltage VR and the time when the enhanced voltage VA is added may be different from each other.

Figure 4:
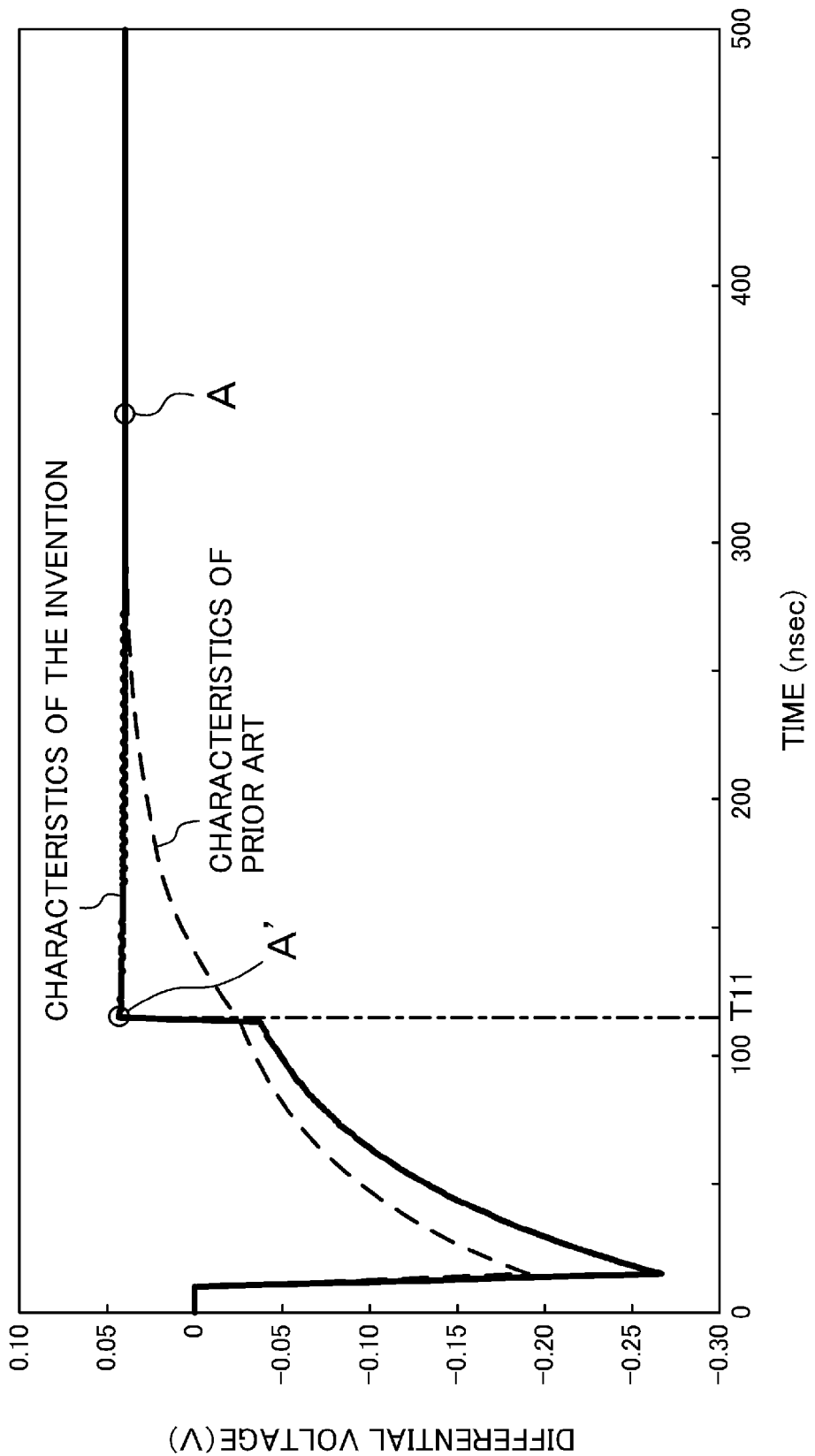
FIG. 4 shows differential characteristics before and after a delay of a reference signal in the ramp-signal generator circuit of the first embodiment.

FIG. 4 shows a difference between the reference signal Vr and the reference signal Vre at each time. This graph shows that the difference reaches a linear region at point A in a conventional configuration, whereas the difference has substantially reached the linear region at point A', i.e., and the linear region is extended in this embodiment.

Specific means for achieving the above feature of this embodiment will now be described.

First, a ramp start voltage Vrs, which is a voltage necessary for having the voltage difference between the reference signal Vr and the reference signal Vre reach the linear region in outputting a ramp signal as the reference signal Vr, is derived.

Here, a voltage difference ΔVr at a time in the linear region is obtained by:

$$\Delta Vr = \tau \cdot Gr \qquad \text{(Equation 1)}$$

where τ is a transmission delay time caused by a path of the reference signal Vr and an input load of the comparators 160 in the column parallel ADC 120 and Gr is the slope of a ramp waveform (a ramp signal). In FIG. 3, the reference signal Vr when the ramp-signal generator circuit 130 starts outputting a ramp signal (i.e., time T11) is at the comparator initialization voltage VR. Thus, the voltage Vrs at this time is obtained by Equation 2:

$$Vrs = VR - \Delta Vr$$
$$= VR - \tau \cdot Gr \qquad \text{(Equation 2)}$$

Since the comparator initialization voltage VR and the slope Gr of the ramp signal have been already obtained, it is sufficient to obtain a transmission delay time τ or an actually measured value of the voltage difference ΔVr in order to obtain a ramp start voltage Vrs.

In the example of FIG. 3, the voltage descends in the ramp waveform, the following expressions are established:

$$Gr < 0$$
$$\therefore Vrs > VR \qquad \text{(Expression 3)}$$

The result of Expression 3 shows that at time T11 when the ramp-signal generator circuit 130 starts outputting a ramp signal, it is inevitably necessary in FIG. 3 to change the conventional comparator initialization voltage VR to the comparator initialization voltage VE where VE>Vrs in order to have the reference signal Vre coincide with the ramp start voltage Vrs.

Here, with respect to the reference signal Vr in FIG. 3, as long as the comparator initialization voltage VE can be maintained in a sufficiently long period, setting the comparator initialization voltage VE at Vrs (i.e., VE=Vrs) can easily have the voltage of the reference signal Vre coincide with the ramp start voltage Vrs at a time (time T11) when the ramp-signal generator circuit 130 starts outputting the ramp waveform. To shorten a period necessary for AD conversion in the column parallel ADC 120, however, a period until the reference signal Vre and the ramp start voltage Vrs coincide with each other needs to be reduced. In this case, it is preferable to control the enhanced voltage VA (the comparator initialization voltage VE).

In addition, because of a variation in a load on a path of the reference signal Vr, it is difficult to have the comparator initialization voltage VE (the enhanced voltage VA) coincide with the ramp start voltage Vrs by calculation.

In view of this, it is conceivable, for example, that the voltage of the reference signal Vre when the ramp-signal generator circuit 130 starts outputting a ramp signal as the reference signal Vr by using a period (e.g., after power-on of a power source or a vertical blanking interval) in which an image output of the imaging system is invalid is measured, and, after performing calibration for controlling the comparator initialization voltage VE (the enhanced voltage VA) such that the voltage of the reference signal Vre coincides with the ramp start voltage Vrs, an effective image period is started.

It is also conceivable, for example, that a time difference between a time until the reference signal Vr reaches a predetermined voltages and a time until the reference signal Vre reaches the predetermined voltage are measured at an initial point of an output period of a ramp signal and a stabilization point when the slope of the ramp signal is stabilized and, based on a result of comparison of the time differences, calibration for controlling the comparator initialization voltage VE is performed. An example of control of the comparator initialization voltage VE using feedback control based on the measurement of this time difference will now be described.

Figure 5:
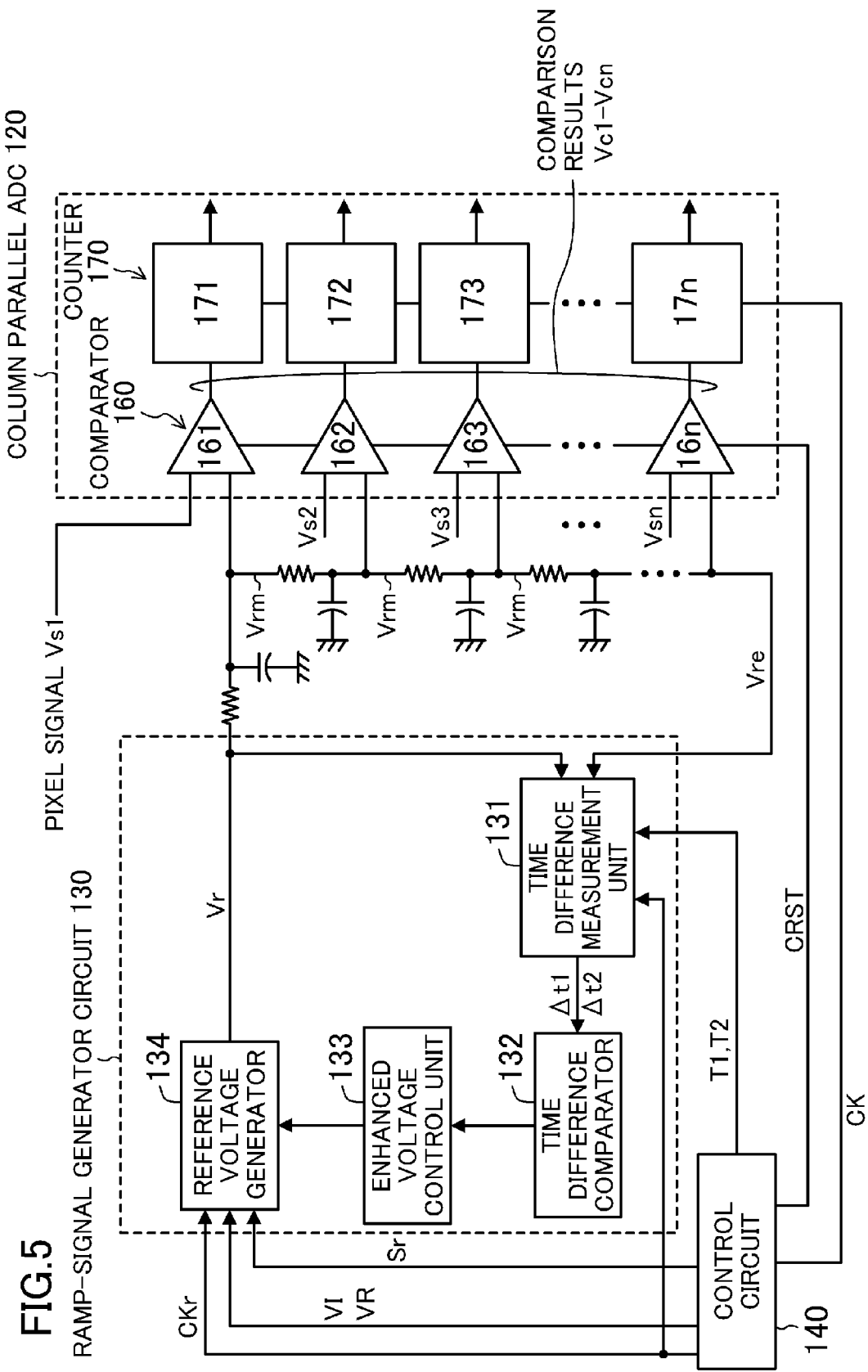
FIG. 5 illustrates an example configuration of the ramp-signal generator circuit of the first embodiment and an example connection of its peripheral circuits.

FIG. 5 illustrates an example configuration of the ramp-signal generator circuit 130 and an example connection of its peripheral circuits according to the first embodiment.

The ramp-signal generator circuit 130 includes a time difference measurement unit 131, a time difference comparator 132, an enhanced voltage control unit 133, and a reference voltage generator 134.

The column parallel ADC 120 is an ADC having n columns (where n is a natural number), and includes comparators 160 (161-16n) and counters 170 (171-17n). Each of the comparators 160 (161-16n) compares a reference signal Vrm or Vre input to one input terminal of the comparator with an associated one of pixel signals Vs1-Vsn input to the other input terminal of the comparator. Each of the counters 170 (171-17n) counts a time, which is a comparison time of an associated one of the comparators 160 (161-16n), from a count start of the counter 170 to a reverse of output of the comparator 160, and outputs an analog-to-digital conversion result as a digital signal. The reference signal Vrm refers to a reference signal input to one input terminal of each of the comparators 161-16(n−1).

The control circuit 140 supplies a reset signal CRST to the comparators 160, and also supplies, to the ramp-signal generator circuit 130, a control signal Sr for regulating the timing of initialization of an output state of the comparators 160 through the reference signal Vr. In addition, the control circuit 140 supplies, to the counters 170, a counter clock CK for correlating an output period of a sloped ramp signal in the reference signal Vr and the count values of the counters 170, and also supplies a ramp signal generation clock CKr for use in generation of a ramp signal to the ramp-signal generator circuit 130. The control circuit 140 also supplies timing signals T1 and T2 to the time difference measurement unit 131.

Here, a wiring resistance and a wiring capacitance are present on a path from an output section of the ramp-signal generator circuit 130 to the input section of each of the comparators 160 (161-16n) of the column parallel ADC 120. The reference signal Vre connected to the input of the comparator 16n located farthest from the ramp-signal generator circuit 130 has the longest delay time of the reference signal Vr.

In view of this, the time difference measurement unit 131 measures a time difference between the reference signal Vre having the largest delay and the reference signal Vr at two points of time, i.e., at time T1 in an initial point of a sloped ramp signal period and at time T2 in a stabilization point, and outputs a time difference $\Delta t1$ and a time difference $\Delta t2$ at the respective times T1 and T2 to the time difference comparator 132. In the above example, the time difference between the reference signal Vre and the reference signal Vr is measured. Alternatively, a time difference between the reference signal Vrm at the input section of the comparators 160 located in another column and the reference signal Vr may be measured. It should be noted that it is preferable to measure the time difference between the reference signal Vre and the reference signal Vr.

Figure 6:
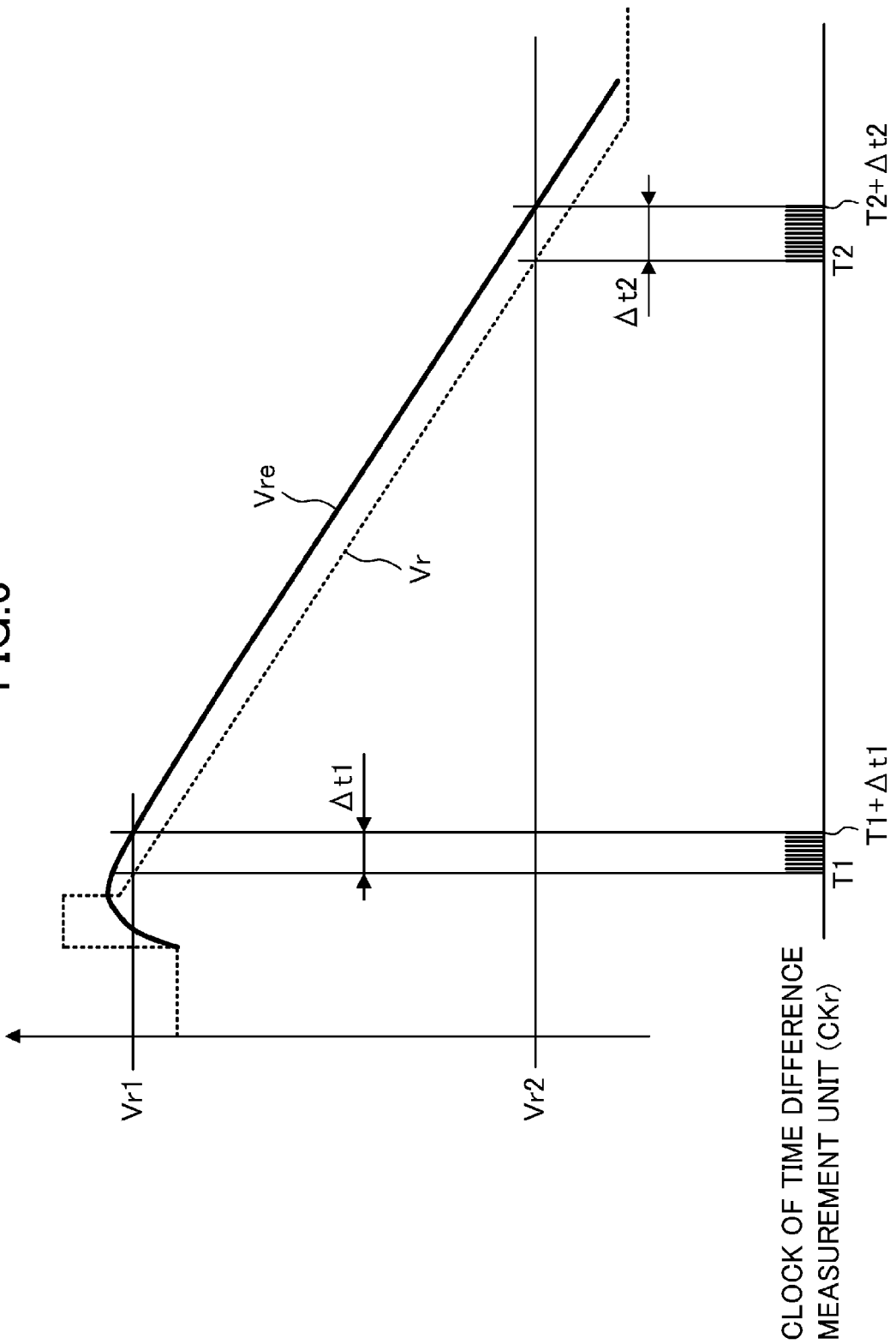
FIG. 6 shows operation of a time difference measurement unit according to the first embodiment.

FIG. 6 shows example relationships between times T1 and T2 and time differences $\Delta t1$ and $\Delta t2$ described above. In FIG. 6, the dotted line represents the reference signal Vr, and the continuous line represents the reference signal Vre. It is assumed that the slope of the reference signal Vr is negative.

At time T1, the time difference measurement unit 131 holds the voltage of the reference signal Vr as a reference signal voltage Vr1, and starts internal counting based on the ramp signal generation clock CKr and comparison between the reference signal voltage Vr1 and the reference signal Vre. Then, the time difference measurement unit 131 outputs, to the time difference comparator 132, a time difference $\Delta t1$ where the reference signal Vr and the reference signal Vre reach the reference signal voltage Vr1, from an internal count value when Vre≤Vr1. Thereafter, the time difference comparator 132 holds the time difference $\Delta t1$ output from the time difference measurement unit 131.

Similarly, at time T2, the time difference measurement unit 131 holds the voltage of the reference signal Vr as a reference signal voltage Vr2, and starts internal counting based on the ramp signal generation clock CKr and comparison between the reference signal voltage Vr2 and the reference signal Vre. Then, the time difference measurement unit 131 outputs, to the time difference comparator 132, a time difference $\Delta t2$ where the reference signal Vr and the reference signal Vre reach the reference signal voltage Vr2, from an internal count value when Vre≤Vr2. Thereafter, the time difference comparator 132 holds the time difference $\Delta t2$ output from the time difference measurement unit 131.

The time difference comparator 132 compares the time difference $\Delta t1$ and the time difference $\Delta t2$ with each other, and outputs a comparison result to the enhanced voltage control unit 133. Based on the comparison result from the time difference comparator 132, the enhanced voltage control unit 133 changes the comparator initialization voltage VE (the enhanced voltage VA) of the reference voltage generator 134. For example, in the case of $\Delta t1 < \Delta t2$, the enhanced voltage control unit 133 increases the comparator initialization voltage VE, while reducing the comparator initialization voltage VE in the case of $\Delta t1 > \Delta t2$. The control state of the enhanced voltage control unit 133 is preferably updated at each series of AD conversion in a manner similar to the reset (initialization) of the comparators 160 based on the reset signal CRST.

The foregoing operation is repeatedly performed in, for example, a period in which an image output of the imaging system is invalid, thereby optimizing the setting of the comparator initialization voltage VE (the enhanced voltage VA).

Here, time T1 is set at a point of time when an output of the ramp signal generation clock CKr is started in the case where the reference signal Vr has an ideal waveform. However, in an actual waveform of the reference signal Vr, the waveform has been already rounded under the influence of, for example, an output impedance of the ramp-signal generator circuit 130, and thus, it is preferable to set time T1 at a point of time when a predetermined time has been elapsed since the output of the ramp signal generation clock CKr was started.

Figure 7A:
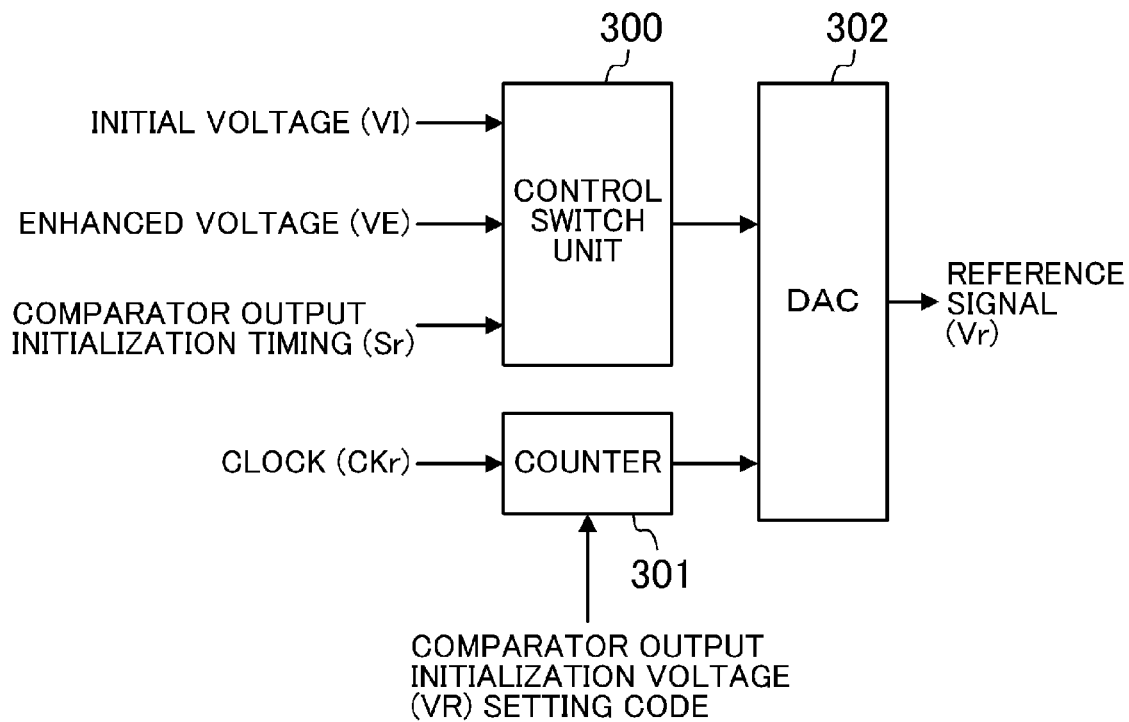
FIG. 7A illustrates an example configuration of a reference voltage generator according to the first embodiment.
Figure 7B:
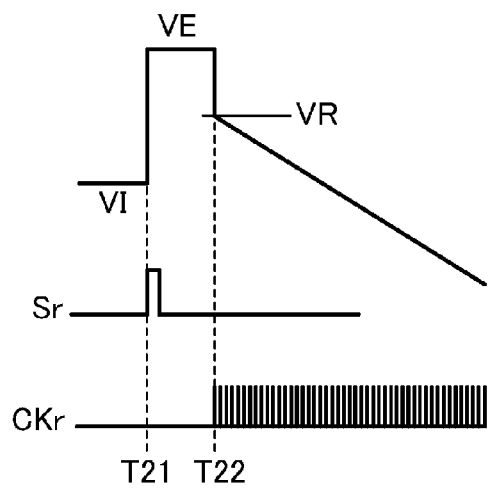
FIG. 7B shows operation of the reference voltage generator.
Figure 12:
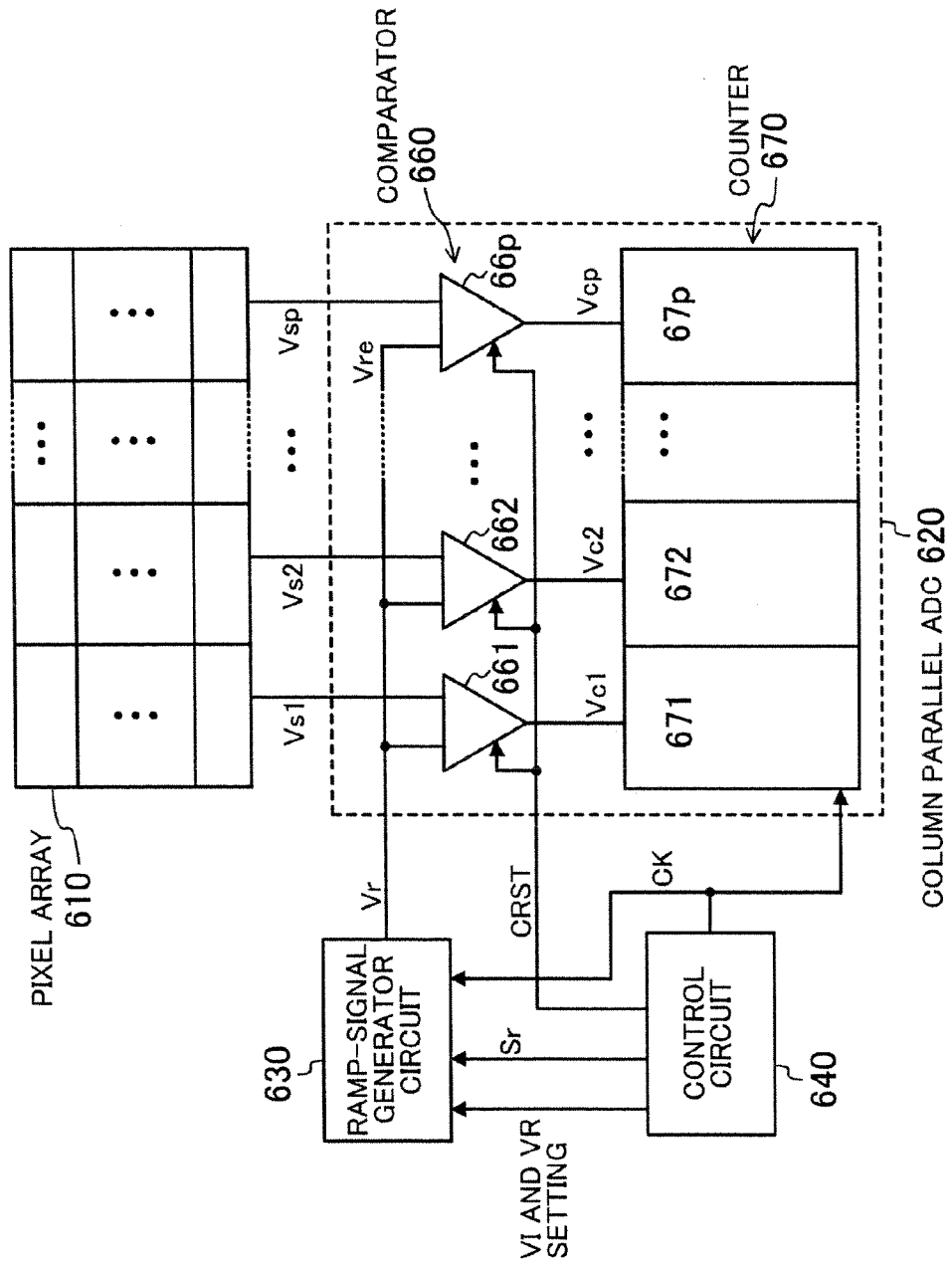
FIG. 12 is a block diagram illustrating an example configuration of a conventional image sensor.
Figure 13:
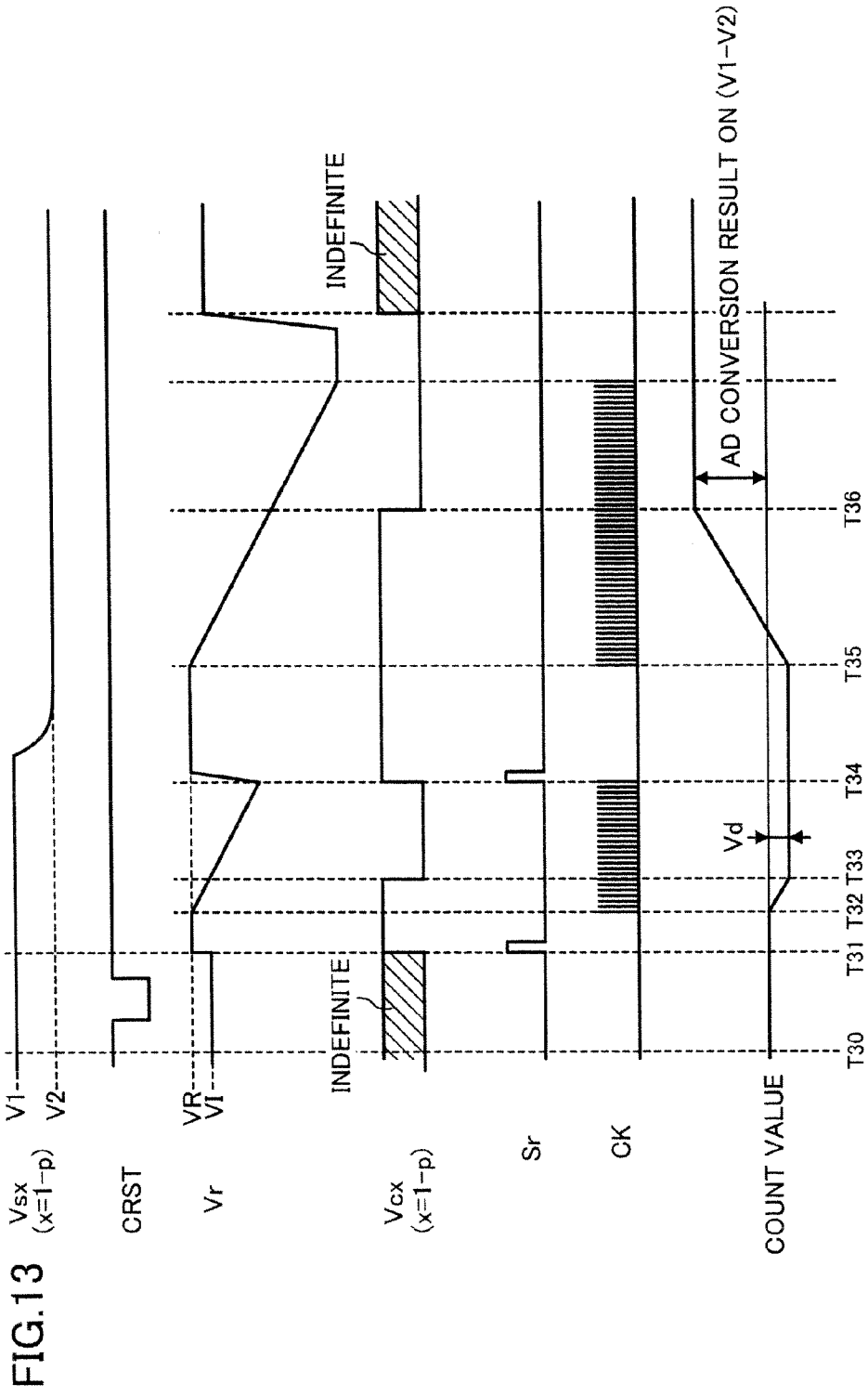
FIG. 13 is a timing chart showing operation of the conventional image sensor.
Figure 14:
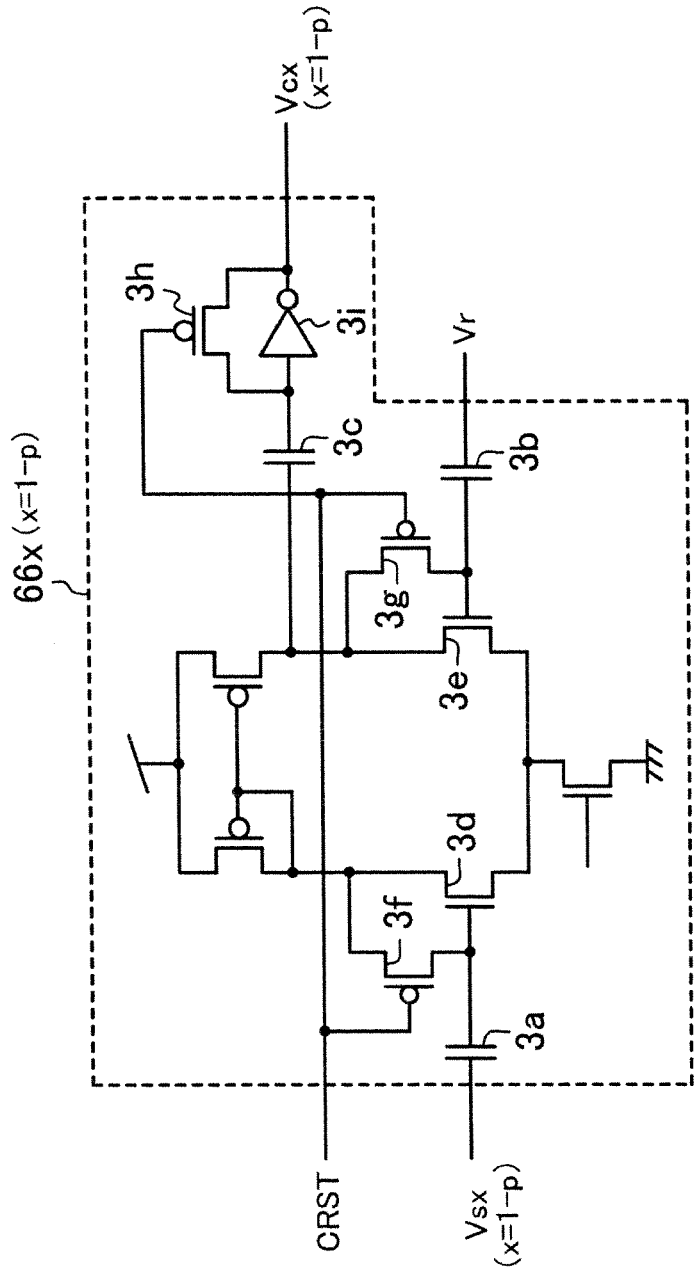
FIG. 14 illustrates an example inner circuit of a comparator included in a conventional ADC.
Figure 15:
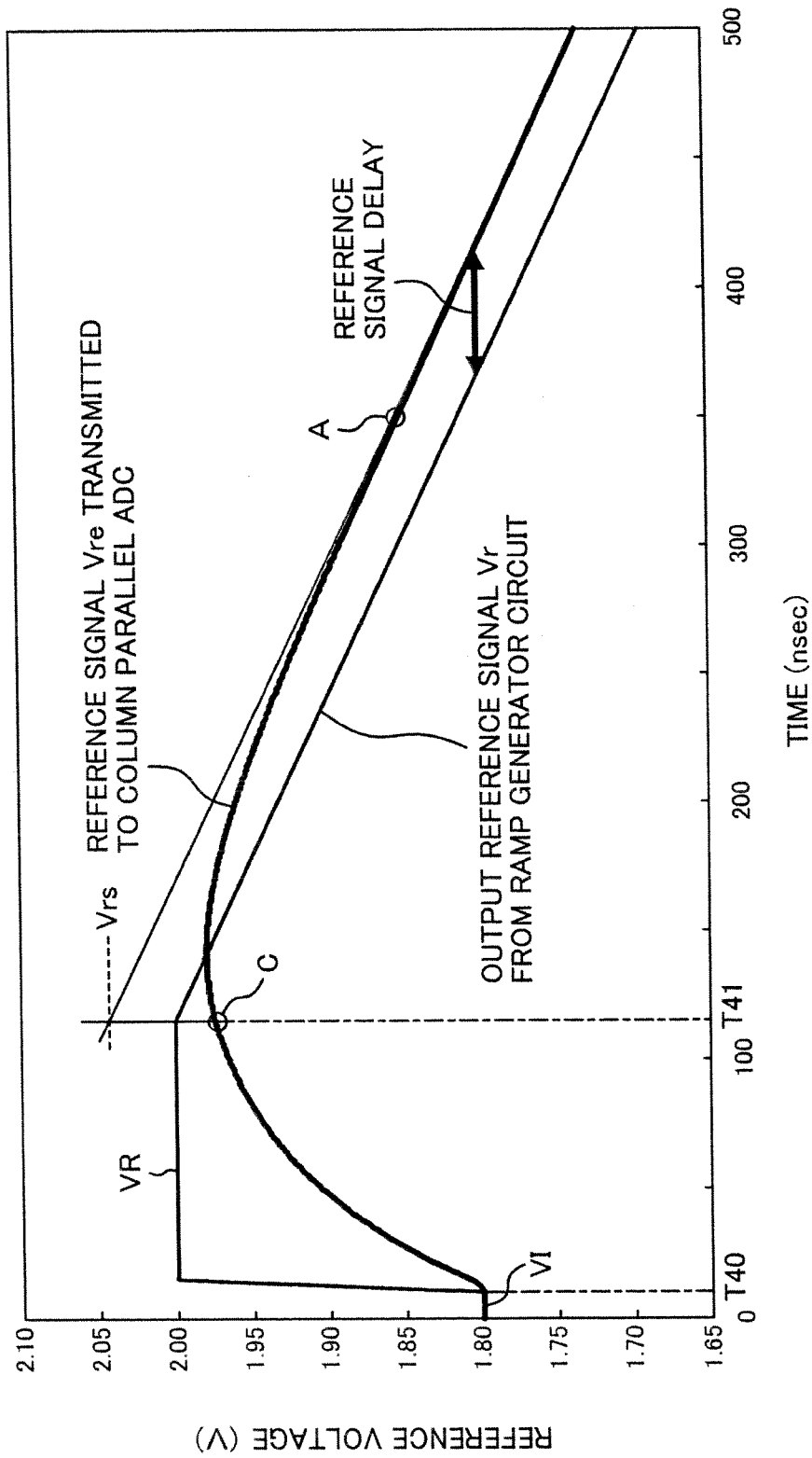
FIG. 15 shows an example reference signal waveform of a conventional ramp-signal generator circuit.
Figure 16:
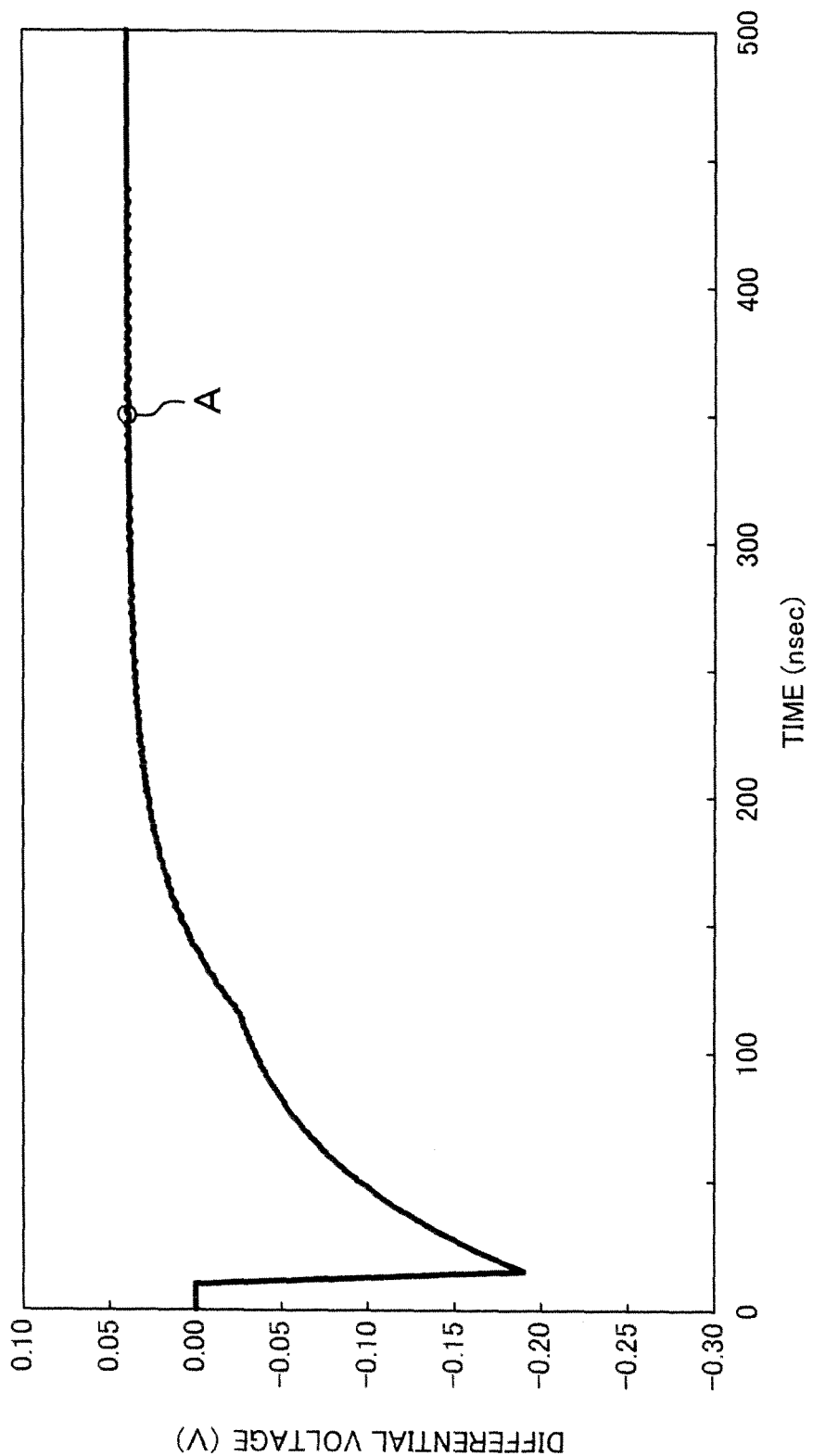
FIG. 16 shows differential characteristics before and after a delay of a reference signal in the conventional ramp-signal generator circuit.
Figure 17:
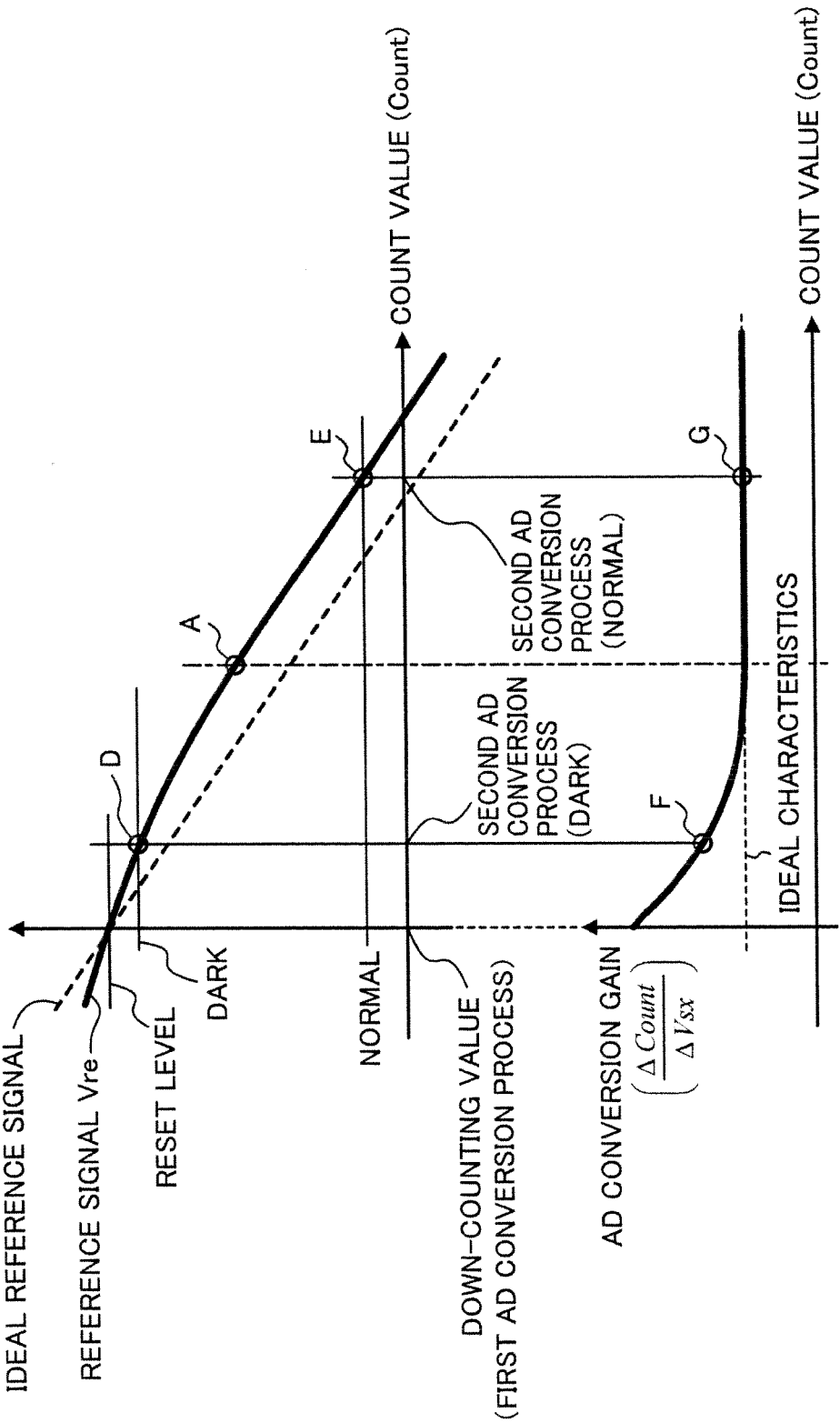
FIG. 17 shows a relationship between a reference signal in the conventional ramp-signal generator circuit and AD conversion characteristics of an ADC.

FIG. 7A is a block diagram illustrating an example configuration of the reference voltage generator 134. The reference voltage generator 134 includes a control switch unit 300, a counter 301, and a digital-to-analog converter (DAC) 302. FIG. 7B schematically shows a change of the reference signal Vr.

In FIG. 7B, before time T21, the control switch unit 300 sets the reference signal Vr at the initial voltage VI based on a control signal (an initial voltage (VI) setting signal) input from the control circuit 140, through the DAC 302. Then, at time T21, based on a control signal (i.e., an enhanced voltage (VE (VA)) setting signal) input from the enhanced voltage control unit 133, the control switch unit 300 changes the reference signal Vr from the initial voltage VI to a comparator initialization voltage VE to which the enhanced voltage VA is added, through the DAC 302. When the control circuit 140 starts supplying a ramp signal generation clock CKr at time T22, the counter 301 sets a comparator output initializing voltage (VR) setting code input from the control circuit 140 at an initial value of a count, and the DAC 302 changes the reference signal Vr to the comparator initialization voltage VR. Thereafter, the DAC 302 outputs, as the reference signal Vr, a ramp signal whose slope starts from the voltage VR, based on a count value of the counter 301.

At this time, in FIG. 5, the control circuit 140 starts supplying a counter clock CK to the counters 170, and the counters 170 start counting. Specifically, the counters 170 count, using the counter clock CK, times until comparison results obtained by the comparators 160 (161-16n) between the pixel signals Vs1-Vsn input from the pixel array 110 and the reference signal Vrm or Vre are reversed.

The enhanced voltage control unit 133 includes an up/down counter, and based on a comparison result of the time difference comparator 132, controls an increase/decrease of a digital code to be output to the control switch unit 300, thereby adjusting the comparator initialization voltage VE. The enhanced voltage control unit 133 is not limited to the above configuration as long as the enhanced voltage control unit 133 adjusts the comparator initialization voltage VE. The enhanced voltage control unit 133 may have various configurations depending on the configuration of the reference voltage generator 134, and may have a configuration different from that described above.

FIGS. 8 and 9 are circuit diagrams illustrating other configurations of the reference voltage generator 134.

FIG. 8 illustrates an example of a configuration in which voltage-divider taps of resistor ladders (an enhanced voltage resistor ladder 400 and an initial voltage resistor ladder 401) are selected by a ladder selection control circuit 402 so that a desired reference signal Vr is output. The initial voltage VI is set by the voltage-divider taps of the initial voltage resistor ladder 401 selected based on a control signal (an initial voltage (VI) selection signal) from the control circuit 140. The comparator initialization voltage VE is set by the voltage-divider taps of the enhanced voltage resistor ladder 400 selected based on a control signal (an enhanced voltage (VE) selection signal) from the enhanced voltage control unit 133. At this time, the comparator initialization voltage VR is a predetermined fixed voltage. The comparator initialization voltage VR may be a previously set voltage VR or may be set from an external device. Then, in response to the ramp signal generation clock CKr, the voltage-divider taps of the initial voltage resistor ladder 401 are sequentially switched toward the voltage Vref, and a ramp signal is output as the reference signal Vr.

FIG. 9 illustrates an example configuration using a current-reference-type DAC. The initial voltage VI, the comparator initialization voltage VR, and the comparator initialization voltage VE to which the enhanced voltage VA is added are set by controlling an output bias resistor 500 based on control signals from the control circuit 140 and the enhanced voltage control unit 133. Then, based on a count value of a counter 501 that has received the ramp signal generation clock CKr, on/off of a switch 502 of a current source is controlled, and a ramp signal that is sloped in terms of time with a predetermined inclination is output as the reference signal Vr. The ramp signal that is sloped in terms of time with a predetermined inclination may be a smoothly sloped waveform or a stepwise waveform as long as the signal is sloped in terms of time with a predetermined inclination.

As described above, in this embodiment, a time difference between a time until the reference signal Vr reaches a predetermined voltage and a time until the reference signal Vre reaches the predetermined voltage is measured at the predetermined points, and these measured time differences are compared with each other, and calibration is performed based on a result of this comparison. Accordingly, even when an excessive load is applied to the reference signal Vr, the difference between the reference signal Vr and reference signal Vre can quickly reach a linear region. In this manner, the linear region of the difference between the reference signal Vr and the reference signal Vre extends, thereby shortening a period necessary for AD conversion. In addition, even in a shortened period of AD conversion, accurate AD conversion can be performed. Furthermore, even with a variation of a load on the voltage path among devices, the feedback control can reduce a variation in characteristics while maintaining excellent AD conversion characteristics.

In FIG. 7B, the counter 170 receives the counter clock CK and starts counting of outputs of the comparators at time T22 when output of a ramp signal is started. Alternatively, counting may be started with a delay of time Δt1 after the start of supply of the ramp signal generation clock CKr. In this manner, counting of the counter 170 can be started when a reference signal Vr comes to have substantially the same voltage as that of the reference signal Vre at an output of a ramp signal. As a result, a down-counting range can be effectively used.

In this embodiment, with respect to the internal counting direction of the time difference measurement unit 131, the function of switching between up/down operations of the first and second AD conversion process in a digital CDS may be provided, so that the enhanced voltage control unit 133 cumulatively adds time differences Δt1 and Δt2 output from the time difference measurement unit 131. Based on a result of this cumulative addition, the enhanced voltage control unit 133 adjusts the comparator initialization voltage VE. In this process, the time difference comparator 132 is unnecessary.

That is, without the difference comparator 132, similar advantages as those of this embodiment can be obtained.

Second Embodiment

FIG. 10 illustrates an example configuration of a ramp-signal generator circuit and an example connection of its peripheral circuits according to a second embodiment. In FIG. 10, components similar or identical to those illustrated in FIG. 5 are denoted by the same reference characters as those used in FIG. 5, and descriptions thereof will not be repeated.

Unlike the example illustrated in FIG. 5, a ramp-signal generator circuit 130A illustrated in FIG. 10 includes a voltage comparator 137 instead of a time difference comparator 132, and additionally includes a voltage measurement unit 135 and a reference voltage measurement unit 136. Here, calibration for controlling a comparator initialization voltage VE is repeatedly performed in, for example, a period in which an image output of the imaging system is invalid. In the following description, a first calibration will be referred to as a first cycle of calibration, a second calibration will be referred to as a second cycle of calibration.

Referring now to FIG. 11, operation of the ramp-signal generator circuit 130A will be described.

In the first cycle of calibration, similarly to the first embodiment, a time difference measurement unit 131 measures a time difference between a reference signal Vr and a reference signal Vre. In the second embodiment, a time difference Δt at time T2 in a stabilization point is measured, and is output to the reference voltage measurement unit 136.

Next, in the second cycle of calibration, the voltage measurement unit 135 measures a reference signal voltage Vr1 of the reference signal Vr at time T1 in an initial point of a sloped ramp signal period is measured, and is output to the voltage comparator 137.

The reference voltage measurement unit 136 measures a reference signal voltage Vr1' of the reference signal Vre at a time (T1+Δt) obtained by adding the time difference Δt output from the time difference measurement unit 131 to time T1, and outputs the measured reference signal voltage Vr1' to the voltage comparator 137.

The voltage comparator 137 compares the reference signal voltage Vr1 with the reference signal voltage Vr1', and outputs a comparison result to an enhanced voltage control unit 133. Based on the comparison result from the voltage comparator 137, the enhanced voltage control unit 133 then adjusts a comparator initialization voltage VE of the reference voltage generator 134. For example, the adjustment is performed such that the enhanced voltage control unit 133 increases the comparator initialization voltage VE in the case of Vr1<Vr1', and reduces the comparator initialization voltage VE in the case of Vr1>Vr1'.

In a third cycle and its subsequent cycles of calibration, operation in the second cycle of calibration is repeatedly performed in, for example, a period in which an image output of the imaging system is invalid, thereby optimizing the setting of the comparator initialization voltage VE. In the third cycle and its subsequent cycles of calibration, the operation in the first cycle of calibration may be performed in addition to the operation in the second cycle of calibration. For example, in the third cycle and its subsequent cycles of calibration, the operation in the first cycle of calibration and the operation in the second cycle of calibration may be alternately performed.

As described above, in this embodiment, the voltage difference between the reference signal Vr and the reference signal Vre is measured at predetermined points, and these measured time differences are compared with each other. Then, based on a result of this comparison result, calibration is performed. Accordingly, even when an excessive load is applied to the reference signal Vr, the difference between the reference signal Vr and reference signal Vre can quickly reach a linear region. In this manner, the linear region of the difference between the reference signal Vr and the reference signal Vre extends, thereby shortening a period necessary for AD conversion. In addition, even in a shortened period of AD conversion, accurate AD conversion can be performed. Furthermore, even with a variation of a load on the voltage path among the devices, the feedback control can reduce a variation in characteristics while maintaining excellent AD conversion characteristics.

Here, a physical pattern design of a reference signal line is performed on ADCs (comparators 160) arranged in n columns such that the wiring resistance and the wiring capacitance are uniform among the columns. Then, delay times are made uniform among the columns, and linearity can be improved for all the n columns of the ADCs. That is, control of the comparator initialization voltage VE based on the time difference and voltage difference between the reference signal Vr and the reference signal Vre in the first and second embodiments can improve linearity for all the n columns of the ADCs.

In the foregoing description, the ramp signal of the reference signal Vr has a descending slope of voltage. Alternatively, the slope Gr of the ramp signal in Equation 2 may be positive, and similar advantages can be obtained with an increasing slope of voltage of the ramp signal.

The comparator initialization voltage VR and the enhanced voltage VA may be changeable independently of each other.

The ramp-signal generator circuits 130 and 130A may be configured to change a period from when the voltage of the reference signal Vr is changed to the comparator initialization voltage VE to a start of output of a ramp signal, before a start of comparison by the comparators 160. Control of a period from the change to the comparator initialization voltage VE to a start of output of a ramp signal may be performed in combination with control of the comparator initialization voltage VE. In this manner, the AD conversion period can be tuned in a minimum period.

The ramp-signal generator circuit 130 may be configured to change an output start time when the ramp signal is output as the reference signal Vr relative to a time of starting counting by the counters 170. Then, the change in period can control the period from the change to the comparator initialization voltage VE to the start of output of the ramp signal, and can also set the time of starting an output of the ramp signal relative to the time of starting counting by the counters 170. In this manner, in a case where the slope of the ramp signal (i.e., the ramp waveform) output from the ramp-signal generator circuit 130 is gentle (i.e., an AD conversion gain is large), when the amplitude of the reference signal Vrm or Vre input to the comparators 160 is small, a failure of termination of AD conversion within a certain down-counting period does not easily occur.

Specifically, in a case where the slope of a ramp signal is gentle as described above, when the amplitude of the reference signal Vrm or Vre input to the comparators 160 is small, a response time from detection of comparison coincidence by the comparators 160 to transmission of a comparison result Vcx to the counters 170 might be long. Thus, with some set gains (slopes of a ramp waveform), AD conversion might fail to terminate within a certain down-counting period. In this case, the start time of the ramp waveform is set much earlier than the counting start time of the counters 170, i.e., a period during which the reference signal Vr holds the comparator initialization voltage VE (or the comparator initialization voltage VR) to which the enhanced voltage VA is added is set at a value close to zero, for example. In addition, the time at which the comparators 160 detect a comparison coincidence is set earlier, and the value of the comparator initialization voltage VE and the start time of the counters 170 are adjusted. In this manner, the possibility of a problem of a failure in termination of AD conversion within a down-counting period can be reduced.

A ramp-signal generator circuit according to the present disclosure can be used as a circuit that supplies a reference signal to a single-slope ADC that needs highly accurate AD conversion even in high-speed driving with an excessive load on a signal path of a reference signal.

Thus, ramp-signal generator circuit according to the present disclosure is useful especially for, for example, a column parallel ADC to be included in an image sensor for a digital camera. An image sensor according to the present disclosure is useful as an image sensor for a digital camera, for example.

What is claimed is:

1. A ramp-signal generator circuit that outputs, to a single-slope analog-to-digital converter circuit, a ramp signal that is sloped in terms of time with a predetermined inclination, as a reference signal, wherein
the analog-to-digital converter circuit includes a comparator having first and second input terminals and configured to receive the reference signal at the first input terminal and to receive an analog input signal at the second input terminal,
the analog-to-digital converter circuit converts the analog input signal into a digital signal based on a result of comparison by the comparator,
the ramp-signal generator circuit includes a reference voltage generator configured to change a voltage of the reference signal to a comparator setting voltage for compensating for a voltage difference between the first and second input terminals of the comparator before the comparison, and configured to output the ramp signal whose slope starts from the comparator setting voltage in response to a start of the comparison, and
the ramp-signal generator circuit is configured to add a predetermined enhanced voltage to the comparator setting voltage before the comparison.

2. The ramp-signal generator circuit of claim 1, wherein
the ramp-signal generator circuit is configured to output the ramp signal after adding the enhanced voltage and then returning the ramp signal to the comparator setting voltage.

3. The ramp-signal generator circuit of claim 1, wherein
the ramp-signal generator circuit is configured to control the comparator setting voltage and the enhanced voltage independently of each other.

4. The ramp-signal generator circuit of claim 1, wherein
the ramp-signal generator circuit is configured to change a period from both the change of the reference signal voltage to the comparator setting voltage and the addition of the enhanced voltage to a start of output of the ramp signal, before a start of the comparison.

5. The ramp-signal generator circuit of claim 1, wherein
the analog-to-digital converter circuit includes a counter configured to count a comparison time of the comparator, and generates the digital signal based on a result of counting by the counter, and
the ramp-signal generator circuit is configured to change a time of starting an output of the ramp signal relative to a time of starting the counting by the counter of the analog-to-digital converter circuit.

6. The ramp-signal generator circuit of claim 1, further comprising:
a time difference measurement unit configured to measure a time difference between a time when an output voltage of the reference voltage generator reaches a predetermined voltage and a time when a voltage at the first input terminal of the comparator reaches the predetermined voltage;
a time difference comparator configured to compare a first time difference that is the time difference measured by the time difference measurement unit at an initial point of an output period of the ramp signal with a second time difference that is the time difference at a point of time when a slope of the ramp signal is stabilized; and
an enhanced voltage control unit configured to control the enhanced voltage such that the first time difference coincides with the second time difference based on a result of the comparison by the time difference comparator.

7. The ramp-signal generator circuit of claim 1, further comprising:
an output voltage measurement unit configured to measure an output voltage of the reference voltage generator;
a reference voltage measurement unit configured to measure a voltage at the first input terminal of the comparator;
a time difference measurement unit configured to measure a time difference between a time when an output voltage of the reference voltage generator reaches a predetermined voltage and a time when a voltage at the first input terminal of the comparator reaches the predetermined voltage;
a voltage comparator configured to compare a first voltage measured by the output voltage measurement unit at a predetermined time in an initial period of an output period of the ramp signal with a second voltage measured by the reference voltage measurement unit when the time difference measured by the time difference measurement unit is elapsed from the predetermined time; and
an enhanced voltage control unit configured to control the enhanced voltage such that the first voltage coincides with the second voltage based on a result of the comparison by the voltage comparator.

8. An image sensor, comprising:
the ramp-signal generator circuit of claim 1;
a pixel array in which unit pixels including photoelectric converters are two-dimensionally arranged in columns and rows and a column signal line is disposed for each column of the pixel array;
a row scanning unit configured to control and select each row of the unit pixels in the pixel array, and to output a result of the control to the column signal line; and
a plurality of the analog-to-digital converter circuits respectively provided for the columns of the unit pixels and each configured to receive an analog signal as the analog input signal from the row scanning unit through the column signal line and output the digital signal.

9. An imaging system, comprising:
the image sensor of claim 8; and
a digital video processor configured to control the image sensor based on a serial control signal, and perform video signal processing based on the digital signal output from each of the analog-to-digital converter circuits of the image sensor.

10. The ramp-signal generator circuit of claim 5, further comprising:
- a time difference measurement unit configured to measure a time difference between a time when an output voltage of the reference voltage generator reaches a predetermined voltage and a time when a voltage at the first input terminal of the comparator reaches the predetermined voltage;
- a time difference comparator configured to compare a first time difference that is the time difference measured by the time difference measurement unit at an initial point of an output period of the ramp signal with a second time difference that is the time difference at a point of time when a slope of the ramp signal is stabilized; and
- an enhanced voltage control unit configured to control the enhanced voltage such that the first time difference coincides with the second time difference based on a result of the comparison by the time difference comparator.

11. The ramp-signal generator circuit of claim 5, further comprising:
- an output voltage measurement unit configured to measure an output voltage of the reference voltage generator;
- a reference voltage measurement unit configured to measure a voltage at the first input terminal of the comparator;
- a time difference measurement unit configured to measure a time difference between a time when an output voltage of the reference voltage generator reaches a predetermined voltage and a time when a voltage at the first input terminal of the comparator reaches the predetermined voltage;
- a voltage comparator configured to compare a first voltage measured by the output voltage measurement unit at a predetermined time in an initial period of an output period of the ramp signal with a second voltage measured by the reference voltage measurement unit when the time difference measured by the time difference measurement unit is elapsed from the predetermined time; and
- an enhanced voltage control unit configured to control the enhanced voltage such that the first voltage coincides with the second voltage based on a result of the comparison by the voltage comparator.

* * * * *